(12) United States Patent
Hanawa et al.

(10) Patent No.: US 7,695,590 B2
(45) Date of Patent: *Apr. 13, 2010

(54) CHEMICAL VAPOR DEPOSITION PLASMA REACTOR HAVING PLURAL ION SHOWER GRIDS

(75) Inventors: Hiroji Hanawa, Sunnyvale, CA (US); Tsutomu Tanaka, Santa Clara, CA (US); Kenneth S. Collins, San Jose, CA (US); Amir Al-Bayati, San Jose, CA (US); Kartik Ramaswamy, Santa Clara, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 603 days.

This patent is subject to a terminal disclaimer.

(21) Appl. No.: 10/873,463

(22) Filed: Jun. 22, 2004

(65) Prior Publication Data
US 2005/0211170 A1 Sep. 29, 2005

Related U.S. Application Data

(60) Provisional application No. 60/556,935, filed on Mar. 26, 2004.

(51) Int. Cl.
| | |
|---|---|
| C23F 1/00 | (2006.01) |
| H01L 21/306 | (2006.01) |
| C23C 16/505 | (2006.01) |
| C23C 16/48 | (2006.01) |
| C23F 1/12 | (2006.01) |
| H01L 21/3065 | (2006.01) |
| C23C 16/06 | (2006.01) |

(52) U.S. Cl. .................. 156/345.39; 156/345.44; 156/345.45; 156/345.47; 156/345.43; 156/345.35; 118/723 E; 118/723 ER; 118/723 FI

(58) Field of Classification Search ............ 156/345.39, 156/345.44, 345, 45, 345.47, 345.43, 345.35; 118/723 E, 723 ER, 723 FI
See application file for complete search history.

(56) References Cited

U.S. PATENT DOCUMENTS 2,344,138 A 3/1944 Drummond ................. 117/107

(Continued)

FOREIGN PATENT DOCUMENTS

EP 0 546 852 A1 6/1993

(Continued)

OTHER PUBLICATIONS

Sobie, Walter, R., "Ion Beam Technology for Thin Film Applications", *Vacuum and Thinfilm*, HIS Publishing Group, Libertyville, IL, Apr. 1999.

(Continued)

*Primary Examiner*—Rudy Zervigon
(74) *Attorney, Agent, or Firm*—Law of Office of Robert M. Wallace

(57) ABSTRACT

A plasma reactor for processing a semiconductor workpiece includes a reactor chamber and a set of plural parallel ion shower grids that divide the chamber into an upper ion generation region and a lower reactor region, each of the ion shower grids having plural orifices in mutual registration from grid to grid, each orifice being oriented in a non-parallel direction relative to a surface plane of the respective ion shower grid. A workpiece support in the process region faces the lowermost one of the ion shower grids. A reactive species source furnishes into the ion generation region a chemical vapor deposition precursor species. The reactor further includes a vacuum pump coupled to the reactor region, a plasma source power applicator for generating a plasma in the ion generation region and a grid potential source coupled to the set of ion shower grids. The orifices through at least some of the ion shower grids have an aspect ratio sufficient to limit ion trajectories in the reactor region to a narrow angular range about the non-parallel direction, and a resistance to gas flow sufficient to support a pressure drop between the ion generation and reactor regions of about at least a factor of 4. The grid potential source can be capable of applying different voltages to different ones of the grids.

31 Claims, 26 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,904,505 A | 9/1975 | Aisenberg | 204/298.04 |
| 3,907,616 A | 9/1975 | Wiemer | 148/188 |
| 3,970,892 A | 7/1976 | Wakalopoulos | 315/111.31 |
| 4,116,791 A | 9/1978 | Zega | 204/192 |
| 4,119,881 A | 10/1978 | Calderon | 313/360.1 |
| 4,157,471 A | 6/1979 | Mlekodaj | 250/432 R |
| 4,158,589 A | 6/1979 | Keller et al. | 156/345.46 |
| 4,351,712 A | 9/1982 | Cuomo et al. | 204/192.34 |
| 4,382,099 A | 5/1983 | Legge et al. | 427/34 |
| 4,385,946 A | 5/1983 | Finegan et al. | 148/175 |
| 4,431,946 A | 2/1984 | O'Laughlin | 315/150 |
| 4,434,036 A | 2/1984 | Hoerschelmann et al. | 204/164 |
| 4,439,684 A | 3/1984 | Hemmerich et al. | 250/396 R |
| 4,443,488 A | 4/1984 | Little et al. | 204/157.44 |
| 4,450,031 A | 5/1984 | Ono et al. | 156/345.39 |
| 4,465,529 A | 8/1984 | Arima et al. | 148/188 |
| 4,478,677 A | 10/1984 | Chen et al. | 156/635 |
| 4,481,229 A | 11/1984 | Suzuki et al. | 427/38 |
| 4,490,210 A | 12/1984 | Chen et al. | 156/643 |
| 4,490,211 A | 12/1984 | Chen et al. | 156/643 |
| 4,493,745 A | 1/1985 | Chen et al. | 156/626 |
| 4,500,563 A | 2/1985 | Ellenberger et al. | 427/38 |
| 4,511,430 A | 4/1985 | Chen et al. | 156/643 |
| 4,521,441 A | 6/1985 | Flowers | 427/38 |
| 4,523,971 A | 6/1985 | Cuomo et al. | 156/345.39 |
| 4,526,673 A | 7/1985 | Little et al. | 204/192.35 |
| 4,534,816 A | 8/1985 | Chen et al. | 156/345 |
| 4,539,217 A | 9/1985 | Farley | 427/10 |
| 4,563,367 A | 1/1986 | Sherman | 427/39 |
| 4,565,588 A | 1/1986 | Seki et al. | 148/186 |
| 4,587,430 A | 5/1986 | Adler | 250/423 R |
| 4,602,981 A | 7/1986 | Chen et al. | 156/627 |
| 4,609,428 A | 9/1986 | Fujimura | 156/643 |
| 4,671,849 A | 6/1987 | Chen et al. | 438/713 |
| 4,698,104 A | 10/1987 | Barker et al. | 437/141 |
| 4,716,491 A | 12/1987 | Ohno et al. | 361/230 |
| 4,741,799 A | 5/1988 | Chen et al. | 438/695 |
| 4,749,911 A | 6/1988 | Wakalopoulos et al. | 315/111.21 |
| 4,755,722 A | 7/1988 | Wakalopoulos | 315/111.31 |
| 4,756,794 A | 7/1988 | Yoder | 216/62 |
| 4,759,948 A * | 7/1988 | Hashimoto et al. | 427/527 |
| 4,764,394 A | 8/1988 | Conrad | 427/38 |
| 4,771,230 A | 9/1988 | Zeh | 324/459 |
| 4,778,561 A | 10/1988 | Ghanbari | 156/643 |
| 4,786,844 A | 11/1988 | Farrell et al. | 315/111.21 |
| 4,792,378 A | 12/1988 | Rose et al. | 438/706 |
| 4,824,544 A | 4/1989 | Mikalesen et al. | 204/298.06 |
| 4,853,102 A | 8/1989 | Tateishi et al. | 204/298.06 |
| 4,867,859 A | 9/1989 | Harada et al. | 304/298 |
| 4,871,421 A | 10/1989 | Ogle et al. | 156/643 |
| 4,877,479 A | 10/1989 | McNeil et al. | 216/60 |
| 4,892,753 A | 1/1990 | Wang et al. | 427/38 |
| 4,901,667 A | 2/1990 | Suzuki et al. | 118/719 |
| 4,912,065 A | 3/1990 | Mizuno et al. | 437/141 |
| 4,931,158 A | 6/1990 | Bunshah et al. | 204/192.29 |
| 4,937,205 A | 6/1990 | Nakayama et al. | 437/165 |
| 4,948,458 A | 8/1990 | Ogle | 156/643 |
| 5,015,331 A | 5/1991 | Powell | 438/723 |
| 5,040,046 A | 8/1991 | Chhabra et al. | 357/54 |
| 5,047,131 A | 9/1991 | Wolfe et al. | 204/192.2 |
| 5,061,511 A | 10/1991 | Saitoh et al. | 427/38 |
| 5,061,838 A | 10/1991 | Lane et al. | 219/121.59 |
| 5,074,456 A | 12/1991 | Degner et al. | 228/121 |
| 5,102,523 A | 4/1992 | Beisswenger et al. | 204/298.33 |
| 5,106,827 A | 4/1992 | Borden et al. | 505/1 |
| 5,107,201 A | 4/1992 | Ogle | 324/72.5 |
| 5,134,301 A | 7/1992 | Kamata et al. | 250/492.2 |
| 5,156,703 A | 10/1992 | Oechsner | 156/643 |
| 5,252,178 A * | 10/1993 | Moslehi | 134/1.1 |
| 5,270,250 A | 12/1993 | Murai et al. | 437/165 |
| 5,277,751 A | 1/1994 | Ogle | 156/643 |
| 5,279,669 A | 1/1994 | Lee | 118/723 |
| 5,284,544 A * | 2/1994 | Mizutani et al. | 156/345.38 |
| 5,286,331 A | 2/1994 | Chen et al. | 156/345 |
| 5,288,650 A | 2/1994 | Sandow | 437/24 |
| 5,290,358 A | 3/1994 | Rubloff et al. | 118/715 |
| 5,290,382 A | 3/1994 | Zarowin et al. | 156/345 |
| 5,312,778 A | 5/1994 | Collins et al. | 437/225 |
| 5,344,352 A | 9/1994 | Horne et al. | 445/24 |
| 5,354,381 A | 10/1994 | Sheng | 118/723 |
| 5,403,459 A | 4/1995 | Guo | 204/192.32 |
| 5,423,940 A | 6/1995 | Chen et al. | 216/66 |
| 5,423,945 A | 6/1995 | Marks et al. | 156/662.1 |
| 5,431,799 A | 7/1995 | Mosley et al. | 204/298.06 |
| 5,435,881 A | 7/1995 | Ogle | 156/345 |
| 5,453,305 A | 9/1995 | Lee | 427/562 |
| 5,468,955 A | 11/1995 | Chen et al. | 250/251 |
| 5,505,780 A | 4/1996 | Dalvie et al. | 118/723 |
| 5,508,368 A | 4/1996 | Knapp et al. | 427/534 |
| 5,510,011 A | 4/1996 | Okamura et al. | 204/192.3 |
| 5,514,603 A | 5/1996 | Sato | 437/16 |
| 5,518,572 A * | 5/1996 | Kinoshita et al. | 156/345.34 |
| 5,520,209 A | 5/1996 | Goins et al. | 137/246 |
| 5,529,670 A | 6/1996 | Ryan et al. | 204/192.15 |
| 5,542,559 A | 8/1996 | Kawakami et al. | 216/67 |
| 5,561,072 A | 10/1996 | Saito | 437/24 |
| 5,562,947 A | 10/1996 | White et al. | 427/255.5 |
| 5,569,363 A | 10/1996 | Bayer et al. | 204/192.32 |
| 5,572,038 A | 11/1996 | Sheng et al. | 250/492.21 |
| 5,572,398 A | 11/1996 | Federlin et al. | 361/234 |
| 5,584,026 A | 12/1996 | Knudsen et al. | 148/1.5 |
| 5,587,038 A | 12/1996 | Cecchi et al. | 156/345 |
| 5,627,435 A | 5/1997 | Jansen et al. | 315/111.21 |
| 5,643,428 A | 7/1997 | Krivokapic et al. | 204/298.11 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,707,486 A | 1/1998 | Collins | 156/643.1 |
| 5,711,812 A | 1/1998 | Chapek et al. | 118/723 |
| 5,718,798 A | 2/1998 | Deregibus | 156/429 |
| 5,728,276 A | 3/1998 | Katsuki et al. | 204/298.11 |
| 5,756,400 A | 5/1998 | Ye et al. | 438/710 |
| 5,763,020 A | 6/1998 | Yang | 427/569 |
| 5,770,982 A | 6/1998 | Moore | 333/32 |
| 5,782,276 A | 7/1998 | Kilgore | 141/332 |
| 5,785,796 A * | 7/1998 | Lee | 156/345.24 |
| 5,858,477 A | 1/1999 | Veerasamy et al. | 427/562 |
| 5,882,468 A * | 3/1999 | Crockett et al. | 156/345.3 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,959,305 A | 9/1999 | Mack et al. | 250/492.21 |
| 5,985,742 A | 11/1999 | Henley et al. | 438/515 |
| 5,994,207 A | 11/1999 | Henley et al. | 438/515 |
| 5,994,236 A | 11/1999 | Ogle | 438/728 |
| 5,998,933 A | 12/1999 | Shun'ko | 315/11.51 |
| 6,000,360 A | 12/1999 | Koshimizu | 118/723 |
| 6,013,567 A | 1/2000 | Henley et al. | 438/515 |
| 6,017,414 A | 1/2000 | Koemtzopoulos et al. | 156/345.25 |
| 6,020,592 A | 2/2000 | Liebert et al. | 250/492.21 |
| 6,036,821 A | 3/2000 | Warren | 204/192.12 |
| 6,041,735 A | 3/2000 | Murzin et al. | 118/723 |
| 6,050,218 A | 4/2000 | Chen et al. | 118/723 |

| | | | |
|---|---|---|---|
| 6,071,573 A | 6/2000 | Koemtzopoulos et al. ... 427/578 |
| 6,076,483 A | 6/2000 | Shintani et al. ............. 118/723 |
| 6,083,363 A | 7/2000 | Ashtiani et al. ........ 204/298.01 |
| 6,096,661 A | 8/2000 | Ngo et al. .................... 438/788 |
| 6,100,536 A | 8/2000 | Ito et al. ................. 250/492.21 |
| 6,101,971 A | 8/2000 | Denholm et al. ............ 118/723 |
| 6,103,599 A | 8/2000 | Henley et al. ............... 438/459 |
| 6,132,552 A | 10/2000 | Donohoe et al. ............ 156/345 |
| 6,139,697 A | 10/2000 | Chen et al. ............. 204/192.15 |
| 6,143,140 A | 11/2000 | Wang et al. ............ 204/192.12 |
| 6,150,628 A | 11/2000 | Smith et al. ........... 219/121.54 |
| 6,153,524 A | 11/2000 | Henley et al. ............... 438/691 |
| 6,155,090 A | 12/2000 | Rubensson .................... 70/367 |
| 6,164,241 A | 12/2000 | Chen et al. .................. 118/723 |
| 6,165,376 A | 12/2000 | Miyake et al. ................. 216/67 |
| 6,174,450 B1 | 1/2001 | Patrick et al. ................... 216/61 |
| 6,174,743 B1 | 1/2001 | Pangrle et al. ................. 438/14 |
| 6,182,604 B1 | 2/2001 | Goeckner et al. ............ 118/723 |
| 6,187,110 B1 | 2/2001 | Henley et al. ............... 148/33.2 |
| 6,207,005 B1 | 3/2001 | Henley et al. ............... 156/345 |
| 6,207,536 B1 | 3/2001 | Matsumotot et al. ........ 438/478 |
| 6,237,527 B1 | 5/2001 | Kellerman et al. ........... 118/723 |
| 6,239,553 B1 | 5/2001 | Barnes et al. ........... 315/111.51 |
| 6,248,642 B1 | 6/2001 | Dolan et al. .................. 438/407 |
| 6,265,328 B1 | 7/2001 | Henley et al. ............... 438/782 |
| 6,267,852 B1 | 7/2001 | Givens et al. ........... 204/192.12 |
| 6,291,313 B1 | 9/2001 | Henley et al. ............... 438/458 |
| 6,291,939 B1 | 9/2001 | Dolan et al. ................. 438/407 |
| 6,300,643 B1 | 10/2001 | Fang et al. ............. 250/492.21 |
| 6,303,513 B1 | 10/2001 | Hsiao ........................ 438/758 |
| 6,305,316 B1 | 10/2001 | DiVergilio et al. .......... 118/723 |
| 6,331,701 B1 | 12/2001 | Chen et al. .................. 250/251 |
| 6,335,536 B1 | 1/2002 | Goeckner et al. ........ 250/492.3 |
| 6,339,297 B1 | 1/2002 | Sugai et al. ............ 315/111.21 |
| 6,341,574 B1 | 1/2002 | Bailey, III et al. ........... 118/723 |
| 6,348,126 B1 * | 2/2002 | Hanawa et al. ......... 156/345.49 |
| 6,350,697 B1 | 2/2002 | Richardson et al. .......... 438/710 |
| 6,352,049 B1 | 3/2002 | Yin et al. ..................... 118/723 |
| 6,361,667 B1 | 3/2002 | Kobayashi et al. ..... 204/298.11 |
| 6,392,187 B1 | 5/2002 | Johnson ................. 219/121.43 |
| 6,392,350 B1 | 5/2002 | Amano .................. 315/111.21 |
| 6,392,351 B1 | 5/2002 | Shun'ko ................. 315/111.51 |
| 6,403,453 B1 | 6/2002 | Ono et al. .................... 438/513 |
| 6,410,449 B1 | 6/2002 | Hanawa et al. ............... 438/706 |
| 6,417,078 B1 | 7/2002 | Dolan et al. .................. 438/480 |
| 6,418,874 B1 | 7/2002 | Cox et al. .................... 118/723 |
| 6,419,985 B1 | 7/2002 | Ishizuka ..................... 427/249.1 |
| 6,426,015 B1 | 7/2002 | Xia et al. ....................... 216/62 |
| 6,432,256 B1 | 8/2002 | Raoux ..................... 156/345.1 |
| 6,433,553 B1 | 8/2002 | Goeckner et al. ........... 324/464 |
| 6,451,184 B1 | 9/2002 | Sone ........................ 204/298.11 |
| 6,453,842 B1 | 9/2002 | Hanawa et al. ............... 118/723 |
| 6,461,972 B1 | 10/2002 | Kabansky .................... 438/710 |
| 6,468,388 B1 | 10/2002 | Hanawa et al. ......... 156/345.48 |
| 6,494,986 B1 | 12/2002 | Hanawa et al. ......... 156/345.35 |
| 6,495,010 B2 | 12/2002 | Sferlazzo ............... 204/298.27 |
| 6,511,899 B1 | 1/2003 | Henley et al. ............... 438/515 |
| 6,512,333 B1 | 1/2003 | Chen ....................... 315/111.21 |
| 6,513,538 B2 | 2/2003 | Chung et al. .................. 134/1.2 |
| 6,514,838 B2 | 2/2003 | Chan ............................ 438/513 |
| 6,521,897 B1 | 2/2003 | Lindquist et al. ............ 250/423 |
| 6,528,391 B1 | 3/2003 | Henley et al. ............... 438/459 |
| 6,551,446 B1 | 4/2003 | Hanawa et al. ......... 156/345.48 |
| 6,559,408 B2 | 5/2003 | Smith et al. ............. 219/121.57 |
| 6,579,805 B1 | 6/2003 | Bar-Gadda ................... 438/710 |
| 6,582,999 B2 | 6/2003 | Henley et al. ............... 438/221 |
| 6,593,173 B1 | 7/2003 | Anc et al. .................... 438/149 |
| 6,602,800 B2 | 8/2003 | Matsuki ....................... 438/778 |
| 6,656,540 B2 * | 12/2003 | Sakamoto et al. ........... 427/564 |
| 6,679,981 B1 | 1/2004 | Pan et al. ................. 204/298.06 |
| 6,752,912 B1 | 6/2004 | Sandhu .................. 204/192.15 |
| 6,800,559 B2 | 10/2004 | Bar-Gadda ................... 438/710 |
| 6,811,448 B1 | 11/2004 | Paton et al. .................. 439/706 |
| 6,838,695 B2 | 1/2005 | Doris et al. .................... 257/55 |
| 6,853,520 B2 | 2/2005 | Fukuzawa et al. ........ 360/324.1 |
| 6,863,019 B2 | 3/2005 | Shamouilian et al. ... 118/723 R |
| 6,892,669 B2 | 5/2005 | Xu et al. .................. 118/723 E |
| 7,244,474 B2 | 7/2007 | Hanawa et al. ............... 427/562 |
| 7,291,360 B2 | 11/2007 | Hanawa et al. ............ 427/248.1 |
| 2001/0021422 A1 | 9/2001 | Yamakoshi et al. ......... 427/569 |
| 2001/0042827 A1 | 11/2001 | Fang et al. |
| 2002/0006478 A1 | 1/2002 | Yuda et al. .................... 427/579 |
| 2002/0047543 A1 | 4/2002 | Sugai et al. ............. 315/111.21 |
| 2002/0113206 A1 | 8/2002 | Chen .......................... 250/251 |
| 2002/0189938 A1 | 12/2002 | Baldwin et al. ........ 204/298.03 |
| 2003/0013314 A1 | 1/2003 | Ying et al. ................... 438/710 |
| 2003/0141831 A1 | 7/2003 | Chen .......................... 315/500 |
| 2005/0056369 A1 | 3/2005 | Lai et al. ................. 156/345.44 |
| 2005/0103445 A1 * | 5/2005 | Brcka et al. ............. 156/345.48 |
| 2005/0110147 A1 | 5/2005 | Wu et al. ..................... 257/758 |
| 2005/0211171 A1 * | 9/2005 | Hanawa et al. ........... 118/723 R |
| 2005/0211546 A1 | 9/2005 | Hanawa et al. ......... 204/192.12 |
| 2005/0211547 A1 | 9/2005 | Hanawa et al. ......... 204/192.23 |
| 2006/0019039 A1 | 1/2006 | Hanawa et al. ............... 438/514 |
| 2006/0019477 A1 | 1/2006 | Hanawa et al. ............... 438/514 |

FOREIGN PATENT DOCUMENTS

| | | |
|---|---|---|
| EP | 0 552 490 A1 | 7/1993 |
| EP | 0 552 491 A1 | 7/1993 |
| EP | 0 836 218 A2 | 4/1998 |
| EP | 0 964 074 A2 | 12/1999 |
| EP | 1 111 084 A1 | 6/2001 |
| EP | 1 191 121 A1 | 3/2002 |
| JP | 59-86214 | 5/1984 |
| JP | 59-218728 | 12/1984 |
| JP | 60-103099 A | 6/1985 |
| JP | 62-120041 | 6/1987 |
| JP | 05188182 A | 7/1993 |
| JP | 20000-144404 | 5/2000 |
| WO | WO 99/00832 | 1/1999 |
| WO | WO 99/01888 | 1/1999 |
| WO | WO 01/11650 A1 | 2/2001 |
| WO | WO 01/86697 | 11/2001 |
| WO | WO 02/25694 A2 | 3/2002 |
| WO | WO 93/18201 | 9/2003 |

OTHER PUBLICATIONS

Van de Ven, Evert P., Connick, I-Wen, and Harrus, Alain S., "Advantages of Dual Frequency PECVD for Deposition of ild and Passivation Films", *IEEE*, Proceedings of VMIC Conference, Jun. 12-13, 1990, pp. 194-201.
Zhang, B.C., and Cross, R.C., "A high power radio frequency transformer for plasma production," *Rev. Sci. Instrum.*, vol. 69, No. 1, pp. 101-108, Jan. 1998.
Official Action Dated Oct. 2, 2006, U.S. Appl. No. 10/896,113.
Official Action Dated Jan. 23, 2007, U.S. Appl. No. 10/896,113.
Official Action Dated Jul. 17, 2007, U.S. Appl. No. 10/896,113.
Official Action Dated Oct. 2, 2007, U.S. Appl. No. 10/896,113.
Official Action Dated Jun. 25, 2008, U.S. Appl. No. 10/896,113.
Official Action Dated Nov. 5, 2008, U.S. Appl. No. 10/896,113.
Official Action Dated Feb. 18, 2009, U.S. Appl. No. 10/896,113.
Official Action Dated Oct. 2, 2006, U.S. Appl. No. 10/896,784.
Official Action Dated Jan. 11, 2007, U.S. Appl. No. 10/895,784.
Official Action Dated Jul. 16, 2007, U.S. Appl. No. 10/895,784.
Official Action Dated Mar. 6, 2008, U.S. Appl. No. 10/895,784.
Official Action Dated Jun. 26, 2008, U.S. Appl. No. 10/895,784.
Official Action Dated May 15, 2009, U.S. Appl. No. 10/895,784.
Official Action Dated Apr. 20, 2007, U.S. Appl. No. 10/873,600.
Official Action Dated Nov. 14, 2006, U.S. Appl. No. 10/873,600.
Official Action Dated Jul. 31, 2007, U.S. Appl. No. 10/873,600.
Official Action Dated Mar. 6, 2008, U.S. Appl. No. 10/873,602.
Official Action Dated Sep. 2, 2008, U.S. Appl. No. 10/873,602.
Official Action Dated Jun. 26, 2009, U.S. Appl. No. 10/873,602.
Official Action Dated Mar. 12, 2008, U.S. Appl. No. 10/873,609.
Official Action Dated Aug. 29, 2008, U.S. Appl. No. 10/873,609.

Official Action Dated Jun. 23, 2009, U.S. Appl. No. 10/873,609.
Official Action Dated Dec. 19, 2006, U.S. Appl. No. 10/873,474.
Official Action Dated Jun. 14, 2007, U.S. Appl. No. 10/873,474.
Official Action Dated Feb. 5, 2008, U.S. Appl. No. 10/873,474.
Official Action Dated Jul. 24, 2008, U.S. Appl. No. 10/873,474.
Official Action Dated Feb. 25, 2009, U.S. Appl. No. 10/873,474.
Official Action Dated Oct. 2, 2006, U.S. Appl. No. 10/896,113.
Official Action Dated Sep. 29, 2009, in Co-pending U.S. Appl. No. 10/873,474.

* cited by examiner

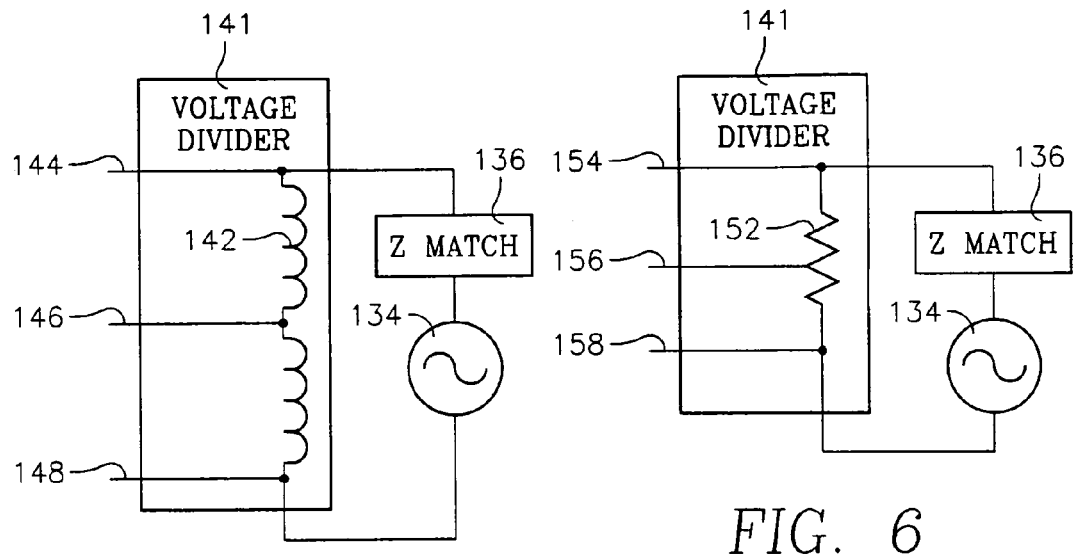
FIG. 5
FIG. 6
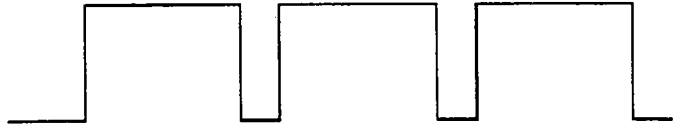
FIG. 7A
FIG. 7B
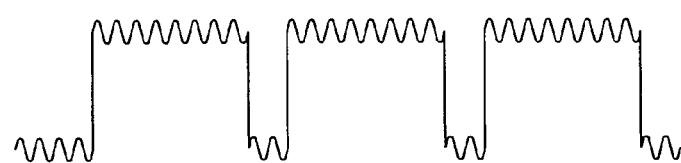
FIG. 7C

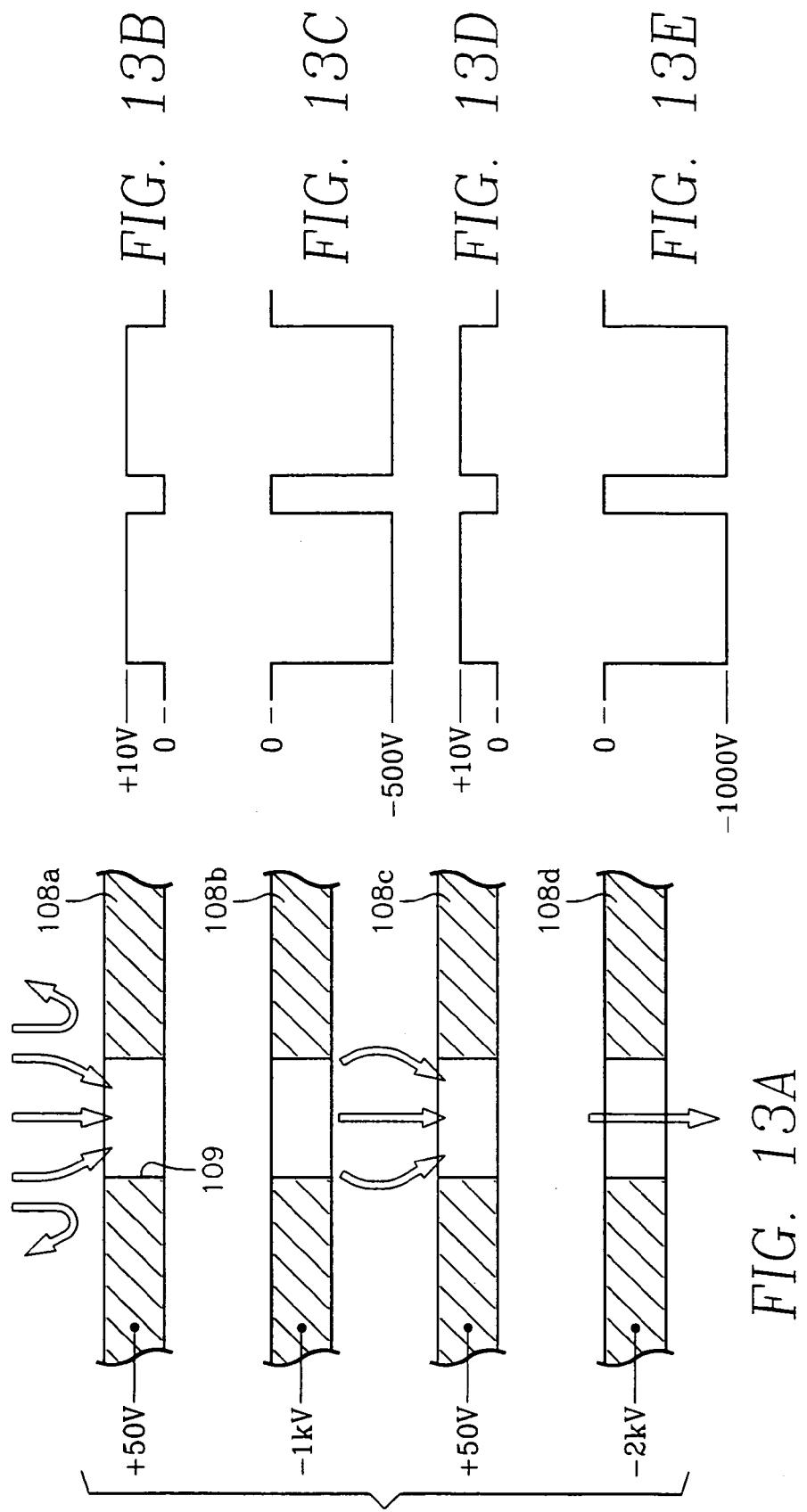

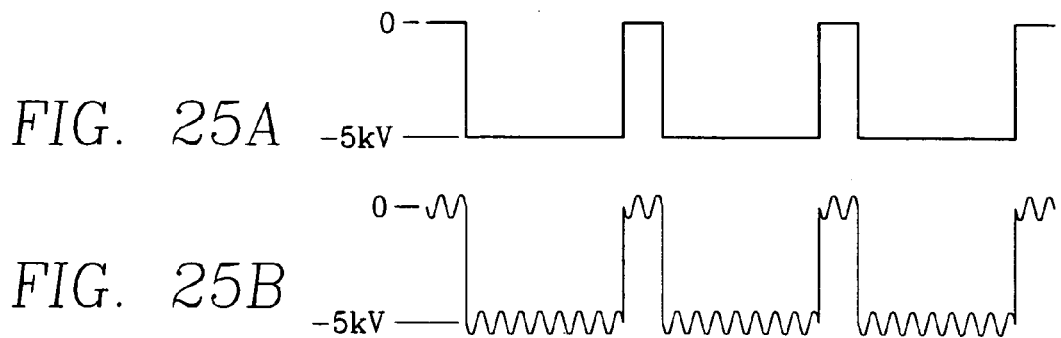
FIG. 25A
FIG. 25B
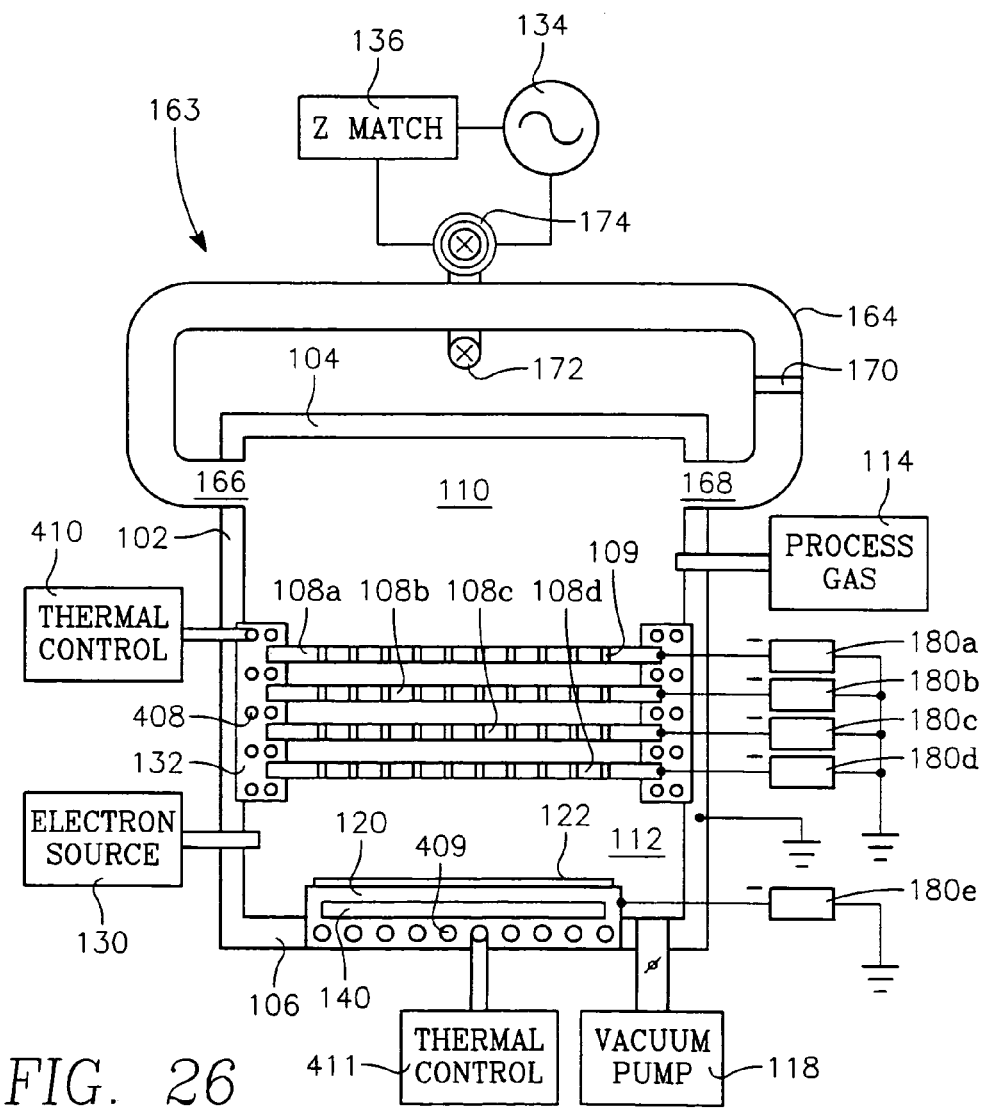
FIG. 26

CHEMICAL VAPOR DEPOSITION PLASMA REACTOR HAVING PLURAL ION SHOWER GRIDS

CROSS-REFERENCE TO RELATED APPLICATIONS

This application claims priority of U.S. Provisional Application Ser. No. 60/556,935, filed Mar. 26, 2004 entitled PLASMA REACTOR AND PROCESS USING ION SHOWER by Hiroji Hanawa, et al. and assigned to the present assignee.

This application contains subject matter related to U.S. application Ser. No. 10/873,485 filed Jun. 22, 2004 entitled CHEMICAL VAPOR DEPOSITION PLASMA PROCESS USING AN ION SHOWER GRID by Hiroji Hanawa, et al.; U.S. application Ser. No. 10/873,600 filed Jun. 22, 2004 entitled CHEMICAL VAPOR DEPOSITION PLASMA PROCESS USING PLURAL ION SHOWER GRIDS by Hiroji Hanawa, et al.; U.S. application Ser. No. 10/873,602 filed Jun. 22, 2004 entitled REACTIVE SPUTTER DEPOSITION PLASMA PROCESS USING AN ION SHOWER GRID by Hiroji Hanawa et al.; U.S. patent application Ser. No. 10/873,609 filed Jun. 22, 2004 entitled REACTIVE SPUTTER DEPOSITION PLASMA REACTOR AND PROCESS USING PLURAL ION SHOWER GRIDS by Hiroji Hanawa et al.; U.S. patent application Ser. No. 10/873,474 filed Jun. 22, 2004 entitled CHEMICAL VAPOR DEPOSITION PLASMA REACTOR HAVING AN ION SHOWER GRID by Hiroji Hanawa et al.; U.S. patent application Ser. No. 10/896,113 filed Jul. 20, 2004 entitled PLASMA IMMERSION ION IMPLANTATION REACTOR HAVING AN ION SHOWER GRID by Hiroji Hanawa et al.; and U.S. patent application Ser. No. 10/895,784 filed Jul. 20, 2004 entitled PLASMA IMMERSION ION IMPLANTATION REACTOR HAVING MULTIPLE ION SHOWER GRIDS by Hiroji Hanawa et al., all of which applications are assigned to the present assignee.

BACKGROUND OF THE INVENTION

In the fabrication of semiconductor microelectronic circuits, chemical vapor deposition processes are employed to fill deep narrow openings or high aspect ratio (HAR) openings, such as isolation trenches and deep contacts. The aspect ratio (the height to diameter ratio) may range from 5:1 to greater than 10:1. Several processes have been employed for this purpose, including sub-atmospheric chemical vapor deposition (SACAVD), plasma enhanced chemical vapor deposition (PECVD) and high density plasma chemical vapor deposition (HDPCVD).

The SACVD process, when used to deposit a silicon dioxide film, typically uses a metal-organic silicide gas a vacuum chamber containing the silicon wafer. The deposition reaction is a thermal reaction carried out at an elevated wafer temperature (e.g., about 500° C.), in which the heat dissociates free oxygen from the ozone gas and silicon from the TEOS molecules, and promotes surface mobility of deposited atoms on the coating. The deposition reaction is conformal, forming a coating of a nearly uniform thickness on both horizontal and vertical surfaces on the semiconductor wafer. Although the reaction is carried out in a vacuum, the chamber pressure is high (e.g., a few hundred Torr) relative to other CVD processes. This relatively high pressure is required to compensate for the slow deposition rate of the SACVD process. Although the wafer temperature is elevated during the deposition to about 500° C., the deposited coating must be annealed at about 700°-900° C. The SACVD process is unsuitable for use on devices having feature sizes 65 nanometers or smaller, and particularly for filling HAR openings in such small devices. First, the deposition rate is slow and the wafer throughput is low. Secondly, this process requires a wafer anneal step, which adds to the production cost of each wafer. Also, the high process temperature and time, and the high (900° C.) anneal temperature required in the SACVD process causes small features (such as doped sources and drains) to diffuse over a significant distance for some applications. Such thermal induced diffusion may cause the source-to-drain channel length to shrink under a permissible threshold below which device failure can occur. Finally, the SACVD process is so conformal that the deposition rate on vertical side walls of HAR openings is as great as the deposition rate on horizontal surfaces (and perhaps greater than on the horizontal bottom surface of a HAR opening). This makes its impossible to completely fill the bottom of a 65 nanometer HAR opening before the top of the opening is pinched off due to accumulation along the vertical side wall. Such accumulation is favored near the top of the side wall of an HAR opening, and will therefore completely block the opening before the bottom of the opening is completely filled. This leaves a void inside the opening, which is unacceptable. A further disadvantage of the SACVD process is that it is relatively slow, requiring that the semiconductor wafer be maintained at the elevated (500° C.) temperature during deposition for a relatively long time, thereby limiting productivity and increasing the thermal diffusion of 65 nanometer features on the wafer.

The PECVD process is carried out at a lower pressure (e.g., 5-15 Torr) than the SACVD process, but attains a higher deposition rate by utilizing a low density plasma to dissociate TEOS and oxygen. In a parallel plate reactor, the low density plasma is generated by applying an RF potential on the order of about a few hundred volts across the plates. The ion to neutral ratio in the low density plasma is quite low (about $10^{-8}$ to $10^{-4}$), and therefore the process is dominated by neutrals. The plasma enhancement of the deposition favors deposition on horizontal surfaces more than vertical surfaces, although the step coverage ratio (vertical wall deposition rate to horizontal wall deposition rate) can be as high as 50%. As a result, when the PECVD process is used for 65 nanometer devices, deposition near the top of the side walls of HAR openings pinches off the openings before they can be filled from the bottom, leaving voids in the openings. This problem can be alleviated somewhat by sputtering of the top edges of the HAR openings (to reduce the deposition rate near the tops of the openings). The problem is that the sputtering efficiency of the low density plasma employed in the PECVD process is poor. This is due to the relatively low plasma ion density (obtained at the low voltage of the plasma source) and because the chamber pressure (5-15 Torr) is too high for efficient sputtering. As a result, sputtering of the top edges of the HAR openings does not always prevent the pinch-off problem. Therefore, the PECVD process is not suitable for filling HAR openings in small (e.g., 65 nanometer) devices.

The HDPCVD process employs a high density plasma at low pressure to promote sputtering of the top corners. To achieve a high ion density, the chamber pressure is maintained at a very low level (e.g., 1-18 mT) using about 10 kW of source power (e.g., for a 300 mm diameter wafer) and a very high bias power (about 2 to 10 kW). The resulting ion density is about $1 \times 10^{17}$ to $3 \times 10^{17}$ $m^{-3}$ for a molecular process gas (such as silane) and about $5 \times 10^{17}$ to $10^{18}$ $m^{-3}$ for an atomic process gas (such as Argon). The ion to neutral ratio in the high density plasma is higher than in PECVD (about $10^{-3}$ to $10^{-2}$). The high bias power produces higher ion energies but does not increase the sheath voltage (or the peak ion energies) beyond about 1000 volts, due to the higher conductivity of the plasma. Under such conditions, the sputtering efficiency is quite good, and is sufficient to reduce the deposition rate near the top edges of HAR openings to prevent pinch-off, at least for large geometry devices. For this purpose, the process gas may include silane and oxygen (for silicon dioxide deposition) and Argon (for sputtering).

As device features are reduced in size, redeposition of sputtered material from one corner occurs at the opposing corner, eventually pinching off the gap. Helium substituted in place of Argon in the HDPDVD process allows filling gaps of higher aspect ratio. At even higher aspect ratio, Hydrogen is substituted for the Helium, producing better gap fill results. The hydrogen performs some sputtering but also performs some chemical etching at the top edges of HAR openings, and provides the best possible sputtering efficiency. This allows the HDPCVD process to be used to fill HAR openings in very small devices approaching 65 nanometers. However, at 65 nanometers, the sputtered material on one side of each HAR opening top edge tends to land on the opposite side, so that there is very little or no net reduction of the accumulation of deposited species at the HAR opening top edge. As a result, at 65 nanometers, the HDPCVD process fails because of pinch-off of HAR openings before they can be completely filled from the bottom. Even at low pressure and high plasma density (ion to neutral ratio about $10^{-3}$ to $10^{-2}$) the process is still dominated by neutrals, leading to eventual pinch-off before small high-aspect-ratio gaps can be filled.

In summary, the advance in semiconductor technology toward 65 nanometer feature sizes is frustrated because of a lack of a reliable chemical vapor deposition process capable of completely filling HAR openings. There is therefore a great need for a chemical vapor deposition process capable of doing so.

SUMMARY OF THE INVENTION

A plasma reactor for processing a semiconductor workpiece includes a reactor chamber and an ion shower grid dividing the chamber into an upper ion generation region and a lower process region, the ion shower grid having plural orifices oriented in a non-parallel direction relative to a surface plane of the grid. A workpiece support in the process region has a workpiece support surface in facing relationship to the ion shower grid. The reactor further includes a reactive species source for introducing into the ion generation region a chemical vapor deposition precursor species, a vacuum pump coupled to the process region, a plasma source power applicator for generating a plasma in the ion generation region and a grid potential source coupled to the ion shower grid. The orifices through the grid have an aspect ratio sufficient to limit ion trajectories in the process region to a narrow angular range about the non-parallel direction and a resistance to gas flow sufficient to support a pressure drop of at least a factor of about 4 across the grid.

BRIEF DESCRIPTION OF THE DRAWINGS

FIG. 5 illustrates one implementation of the voltage divider shown in FIG. 4.

FIG. 6 illustrates another implementation of the voltage divider shown in FIG. 4.

FIG. 7A illustrates the time domain waveform of a voltage applied to the ion shower grid.

FIG. 7B illustrates the time domain waveform of an RF voltage applied to the plasma source power applicator in a reactor such as the reactor of FIG. 3, for example.

FIG. 7C illustrates the plasma potential corresponding to the grid potential and the plasma source power potential of FIGS. 7A and 7B.

FIG. 13A illustrates one mode in which the multiple grids of FIG. 11 are driven in such a way as to focus ion flux through the grid orifices.

FIGS. 13B, 13C, 13D and 13E illustrate contemporaneous time domain waveforms of the individual voltages applied to the individual multiple grids in the mode of FIG. 13A.

FIGS. 25A and 25B are contemporaneous time domain waveforms of an applied pulsed D.C. grid potential and the plasma potential, respectively, in the embodiment of FIG. 24.

FIG. 26 depicts a CVD reactor with a torroidal plasma source and multiple ion shower grids driven in reverse mode.

DETAILED DESCRIPTION OF THE INVENTION

Figure 1:
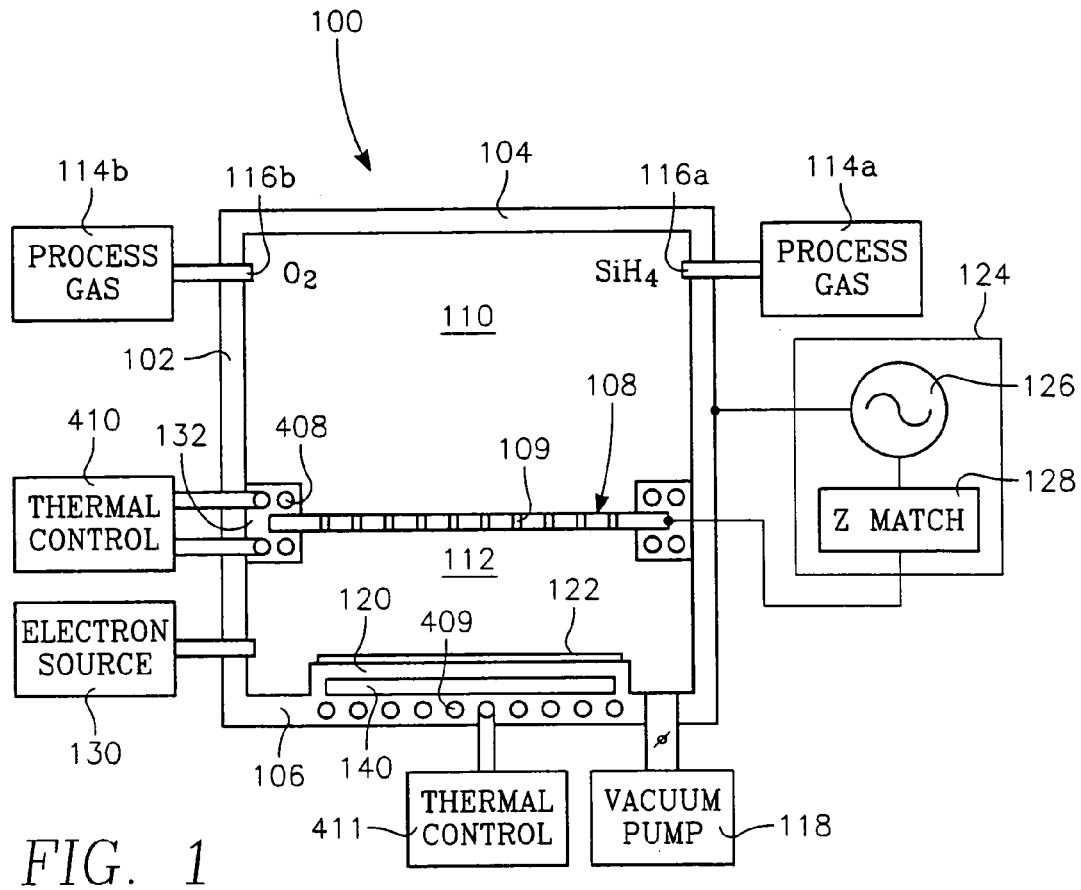
FIG. 1 illustrates a CVD reactor having a single ion shower grid and a single power source furnishing both a grid potential and plasma source power.

Overview:

The invention solves the foregoing problems by dividing the reactor chamber into a plasma generation upper sub-chamber (where plasma is efficiently generated at a higher pressure), and a process lower sub-chamber containing the wafer. In the process sub-chamber, ion trajectory distribution is narrowly centered about the vertical and chamber pressure is lower to reduce ion scattering and recombination. The restriction of ion trajectory to the vertical direction reduces or eliminates the accumulation of deposited material on HAR opening side walls, thus eliminating the problem of pinch off in a CDV process. Instead, a very high proportion of the ions are able to reach the bottom of even the deepest HAR openings, so that they are completely filled without any voids.

In a first embodiment, an ion shower grid, parallel to the wafer and consisting of many vertical openings or holes, divides the plasma reactor chamber into an upper plasma generation sub-chamber and a lower process sub-chamber containing the semiconductor wafer to be processed. Plasma source power is applied to the plasma generation sub-chamber while a deposition precursor process gas is introduced into the plasma generation sub-chamber. The entire chamber is evacuated by a vacuum pump near the bottom of the lower process sub-chamber. The plasma source power may be a voltage (continuous RF, pulsed RF, continuous D.C. or pulsed D.C. or a combination of two or more of the foregoing) applied between the ion shower grid and the portion of the chamber wall surrounding the plasma generation sub-chamber. In this first embodiment, the voltage applied between the grid and chamber enclosure suffices to provide both plasma source power to the upper sub-chamber and an acceleration potential on the grid to attract ions from the plasma in the upper sub-chamber through the grid. The wafer is held at a potential (e.g., ground) attractive to ions passing through the grid. If silicon dioxide is to be deposited in a chemical vapor deposition (CVD) process, then the process gas may be a mixture of silane and oxygen, for example.

The ion shower grid consists of many closely spaced narrow openings whose axes are generally perpendicular to the wafer surface and whose aspect ratio is selected to impart a narrow angular distribution of ions passing through the grid, the narrow angular distribution being generally centered about the perpendicular relative to the wafer surface (i.e., the vertical direction). Optionally, some "tilt" angle (off-vertical may be selected. In addition, the size and aspect ratio of the grid openings are selected to provide a sufficient resistance to gas flow through the grid to achieve a significant pressure drop between the upper plasma generation sub-chamber and the lower process sub-chamber. This pressure drop is sufficient to achieve a very high ion-neutral mean collision path length in the lower process sub-chamber to enhance plasma ion density and minimize scattering of ion trajectories from the desired vertical direction. The higher pressure of the upper plasma generation sub-chamber is sufficient to enhance plasma generation. The gap length or distance between the wafer surface and the grid is sufficient for the finite divergence of the ion trajectory distribution in the lower process sub-chamber to overlap the hole pattern of the ion shower grid at the wafer surface. But, the gap length is sufficiently short (e.g., a fraction of the ion-neutral mean free path length in the lower sub-chamber) to avoid or minimize ion scattering, a feature that is facilitated by the reduced pressure of the lower sub-chamber. At the same time the spacing between the holes in the grid is sufficient to provide a thermal conductance across the area of the grid that is sufficient for a cooling system to regulate the temperature of the grid to avoid bowing of the grid.

The voltage on the grid may have an RF component (or may be a pure sinusoid RF voltage) to attract electrons through the grid every RF half-cycle, so as to provide some charge neutralization on the wafer. Charge neutralization may be achieved, in addition, by imposing a magnetic field around the wafer which traps or confines scattered electrons near the wafer surface. Furthermore, additional electrons may be furnished, if necessary, by independently generating a local plasma near the wafer surface (using a local plasma source power applicator near the wafer) or from an external plasma source whose plasma is fed into the lower process sub-chamber, or from an electron flood gun directed toward the wafer surface.

In a second embodiment, there are multiple parallel grids whose holes are in mutual vertical alignment, each grid being driven by a separate or independent voltage, these voltages being configured to provide a progressive transition from the plasma potential (at the top-most grid) to the highest grid potential (at the bottom grid).

In a third embodiment, the independent voltages applied to the multiple parallel grids are configured to focus the ions to minimize collisions with the side walls of the holes of the grids. This configuration may involve an alternating sequence of acceleration and deceleration voltages from the top grid to the bottom grid.

In a fourth embodiment, the grid voltage source is decoupled from plasma generation by providing a separate plasma source power applicator directed to the upper plasma generation sub-chamber, and may be a reentrant torroidal plasma source. The plasma potential as well as the plasma source power applicator floats at the potential established by the grid voltage source, which may be in the range of 100 to 5000 volts, and the plasma source power voltage is superimposed (floats) on top of the grid potential. By thus decoupling plasma source power from the grid voltage, independent control may be exerted over the plasma ion density and the ion acceleration or grid potential. The grid potential determines the ion velocity profile as well as the ion/neutral population ratio in the lower sub-chamber. For example, at the highest grid voltage, ions are energetically pulled from the plasma in the upper sub-chamber to the lower sub-chamber with a minimum proportion of neutrals. At a minimum or zero grid voltage, there is no preference of ions over neutrals, and the ion/neutral population ratio in the lower chamber is no greater than that in the upper chamber.

In a fifth embodiment, the plasma source power applicator for the upper sub-chamber is a capacitively coupled source. In this embodiment, the capacitive source power applicator may be the reactor chamber ceiling coupled to an RF source power generator. In this case, the power applied to the grid may be an RE voltage at one frequency and the capacitively coupled source power may be an RF voltage applied to the ceiling at a different frequency. The grid voltage may be of a form other than a pure RF sinusoid, such as an RF component in combination with a pulsed or pulsed D.C. component. The grid voltage may be applied across the grid and the wafer or wafer-support-electrode, while the capacitive source power may be applied across the ceiling and the grid, as one possible example.

In a sixth embodiment, the plasma source power applicator is an inductively coupled source. In a seventh embodiment, the plasma source power applicator is an electron cyclotron resonance (ECR) or microwave source.

In an eighth embodiment, the fourth embodiment is modified by holding the plasma potential near ground potential and applying a negative grid voltage to the grid and applying an even greater negative bias voltage to the wafer or wafer-support-electrode. Both the grid voltage and the wafer bias voltage may be RF voltages, or other forms (pulsed, pulsed D.C. or a mixture with RF). In this case, the source power voltage is referenced to ground rather than floating.

In a ninth embodiment, the fifth embodiment is modified by holding the plasma potential near ground potential and applying a negative grid voltage to the grid and applying an even greater negative bias voltage to the wafer or wafer-support-electrode. Both the grid voltage and the wafer bias voltage may be RF voltages, or other forms (pulsed, pulsed D.C. or a mixture with RF). In this case, the source power voltage is referenced to ground rather than floating.

In a tenth embodiment, the sixth embodiment is modified by holding the plasma potential near ground potential and applying a negative grid voltage to the grid and applying an even greater negative bias voltage to the wafer or wafer-support-electrode. Both the grid voltage and the wafer bias voltage may be RF voltages, or other forms (pulsed, pulsed D.C. or a mixture with RF). In this case, the source power voltage is referenced to ground rather than floating.

In an eleventh embodiment, the seventh embodiment is modified by holding the plasma potential near ground potential and applying a negative grid voltage to the grid and applying an even greater negative bias voltage to the wafer or wafer-support-electrode. Both the grid voltage and the wafer bias voltage may be RF voltages, or other forms (pulsed, pulsed D.C. or a mixture with RF). In this case, the source power voltage is referenced to ground rather than floating.

In the foregoing fourth through eleventh embodiments, either a single grid may be employed or multiple parallel grids may be employed.

In a twelfth embodiment, reactive physical vapor deposition is employed in which the upper plasma generation sub-chamber becomes a physical vapor generation chamber by sputtering a target in the upper sub-chamber consisting of a deposition pre-cursor species. A gas such as Argon is introduced in the chamber. Sputtering may be achieved by applying power (such as an RF or DC voltage) to the target, which may be a silicon member mounted on the chamber ceiling interior. A magnet may be mounted outside the ceiling adjacent the target to enhance the sputtering process. In this twelfth embodiment, mostly neutral atoms are generated by sputtering the target, for the most part, so that no voltage need be applied to the grid, the grid acting purely as a collimator of the neutral species flux emanating from the sputtered target. It may not be necessary to introduce a process gas into the upper sub-chamber, which reduces the total gas pressure by reducing the partial pressure of unused species, such as hydrogen in the case of silane process gas. If a combination such as silicon dioxide is to be deposited, then the target may be silicon and a process gas containing oxygen (such as $O_2$ or ozone) may be introduced either into the lower sub-chamber or into the upper sub-chamber. The oxygen-containing gas may also function as the sputtering species without any additional gas such as Argon.

In a thirteenth embodiment, some of the sputtered atoms are ionized in the upper sub-chamber by a plasma source power applicator which may be a reentrant toroidal plasma source power applicator. Thus, the upper sub-chamber becomes one again a plasma generation sub-chamber. In this embodiment, a grid voltage is applied across the grid and the upper sub-chamber housing.

In a fourteenth embodiment, the foregoing embodiment is modified by providing separately driven multiple parallel ion shower grids.

In a fifteenth embodiment, the foregoing embodiment is modified in that the grid voltage is applied across the wafer or wafer-support-electrode and the grid and is a negative voltage, the plasma potential being held near ground potential and the source power applicator being referenced to ground rather than floating on the grid voltage.

In a sixteenth embodiment, some of the sputtered atoms are ionized in the upper sub-chamber by a plasma source power applicator which may be a capacitively coupled plasma source power applicator. In this embodiment, a grid voltage may be applied across the grid and the upper sub-chamber housing at one frequency while the capacitive power is applied across the grid and the ceiling at another frequency, as but one possible example.

In a seventeenth embodiment, the foregoing embodiment is modified by providing separately driven multiple parallel ion shower grids.

In an eighteenth embodiment, the foregoing embodiment is modified in that the grid voltage is applied across the wafer or wafer-support-electrode and the grid and is a negative voltage, the plasma potential being held near ground potential and the source power applicator being referenced to ground rather than floating on the grid voltage.

In a nineteenth embodiment, some of the sputtered atoms are ionized in the upper sub-chamber by a plasma source power applicator which may be an inductively coupled plasma source power applicator. In this embodiment, a grid voltage is applied across the grid and the upper sub-chamber housing.

In a twentieth embodiment, the foregoing embodiment is modified by providing separately driven multiple parallel ion shower grids.

In a twenty-first embodiment, the foregoing embodiment is modified in that the grid voltage is applied across the wafer or wafer-support-electrode and the grid and is a negative voltage, the plasma potential being held near ground potential and the source power applicator being referenced to ground rather than floating on the grid voltage.

In a twenty-second embodiment, some of the sputtered atoms are ionized in the upper sub-chamber by a plasma source power applicator which may be an electron cyclotron resonant or microwave plasma source power applicator. In this embodiment, a grid voltage is applied across the grid and the upper sub-chamber housing.

In a twenty-third embodiment, the foregoing embodiment is modified by providing separately driven multiple parallel ion shower grids.

In a twenty-fourth embodiment, the foregoing embodiment is modified in that the grid voltage is applied across the wafer or wafer-support-electrode and the grid and is a negative voltage, the plasma potential being held near ground potential and the source power applicator being referenced to ground rather than floating on the grid voltage.

Each of the foregoing twenty-four embodiments may be enhanced by controlling ion energy through the selection of the frequency of the grid voltage or the grid-to-wafer voltage (depending upon the embodiment). This is accomplished as follows: The effective electrode surface area presented by the wafer should be less than the surface area of the grid and or surrounding chamber surfaces. This results in an ion energy distribution that is skewed toward the higher energy range and reduced in the lower energy range. The wafer-to-grid potential determines the ion energy as follows: The energy distribution has a maximum range at a lower RF frequency and at a very high frequency is limited to an energy corresponding to half the peak-to-peak voltage of the wafer bias voltage. As the frequency is reduced from the high frequency limit, the ion energy distribution begins to spread out until, as a low frequency, it has a maximum range, approximately from 0V to the peak-to-peak RF voltage. The maximum ion energy is therefore controlled by selecting the bias frequency anywhere within the foregoing range.

For use in CVD processes for filling HAR openings, the grid voltage is selected to minimize ion trajectory divergence from the vertical direction.

For use in etch processes, the grid voltage is selected to control ion energy in accordance with a desired etch rate.

For use in ion implantation processes, the grid-to-wafer bias voltage is produced using a high voltage wafer chuck, and is selected to attain the desired ion implantation profile. The ion implantation species may be dopant species for forming source and drain regions in the wafer. Alternatively, the ion implantation species may be other atoms or molecules selected to modify the wafer surface or near-surface properties (electrical, mechanical, optical, physical, or chemical properties, for example). The ion implantation version may use the embodiment having the grounded plasma and the negatively driven grid and wafer, using the high voltage wafer chuck.

In both ion implantation applications as well as chemical vapor deposition applications or other applications, the grid and/or wafer may driven with the same or different voltages, which may be continuous RF voltages, pulsed RF voltages, continuous D.C. voltages or pulsed D.C. voltages or a combination of these different types of voltages. In the case of multiple parallel grids, different voltages may be used to drive different ones of the grids and the wafer pedestal. Furthermore, the grid closest to the pedestal may be driven with the same voltage driving the pedestal, so that ions only drift through the process sub-chamber, in order to minimize ion beam divergence.

Reactor Structures:

Referring now to FIG. 1, a plasma reactor includes a vacuum reactor chamber 100 defined by a side wall 102, a ceiling 104 and a floor 106. An ion shower grid 108 having plural vertically extending grid orifices 109 separates the chamber 100 into upper and lower sub-chambers 110, 112. Process gas supplies 114a, 114b introduce process gases into the upper chamber 110 through gas injection orifices 116a, 116b. A vacuum pump 118 evacuates the chamber 100 through the floor 106. A wafer pedestal 120 supported on the floor 106 holds a semiconductor wafer 122 in the lower sub-chamber 112. The wafer pedestal 120 may be an electrostatic chuck of the type well-known in the art that holds the wafer 122 by applying a static voltage through an insulator within the chuck and releases the wafer upon termination of the static voltage. An electrical power source 124 is coupled to the chamber 100 so as to apply plasma source power to ionize process gases in the upper chamber 110 and to apply an ion acceleration potential to the grid 108. Thus, in the reactor of FIG. 1, the single power source 124 doubles as both a plasma source power supply and a grid voltage supply. The power supply may generate a pulse D.C. voltage waveform (e.g., +5 kV pulses), or an RF voltage or a combination of both. The power supply 124 may include a pulse generator and/or an RF power generator 126 and an impedance match device 128. The positive side of the power supply 124 is coupled to a conductive or semiconductive wall of the upper ion generation sub-chamber 110 (such as the side wall 102 or ceiling 104). The return side or terminal of the power supply 124 is coupled to the grid 108. Either the wafer support pedestal 120 or the grid 108 (or both) may be grounded or either or both may be ungrounded. A bias voltage source may be coupled to the wafer support pedestal 122 as will be described below in this specification with reference to subsequent embodiments. For this purpose, the wafer support pedestal 122 may be electrically insulated from other conductive components of the reactor, such as the grid 108, the side wall 102 and the ceiling 104.

A source of electrons 130 provides negative charge to the wafer 122 to control or reduce charge accumulation on the wafer 122.

The electrical supply 124 applies a positive voltage to the upper chamber through either the conductive side wall 102 or the conductive ceiling 104, while its return (ground) side is connected to the conductive grid 108. For this purpose, an insulator ring 132 supports the grid 108 on the side wall 102 while electrically insulating the grid 108 from the side wall 102. The voltage applied to the side wall 102 by the supply 124 controls the plasma potential in the upper sub-chamber 110 relative to the grid 108, so as to create an attractive potential at the grid 108 for plasma ions in the upper sub-chamber 110.

Figure 2:
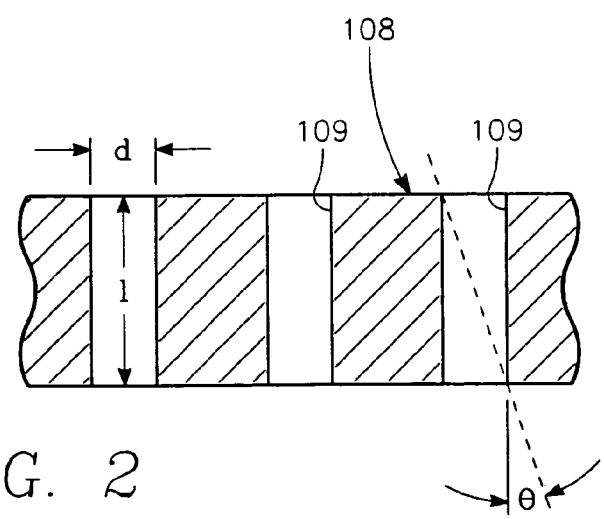
FIG. 2 is a detailed cross-sectional view of an ion shower grid illustrating the orifice structure.

Referring to FIG. 2, each orifice 109 in the grid 108 may be a cylindrical hole on the order of 0.025 to 2.5 millimeter in diameter (d), the length (l) being the thickness of the grid 108, which may be on the order of 0.25 millimeter up to 2.5 centimeter, for example. The dimensions d and l are selected for optimal transmission of ions through the grid 108. The ratio d/l determines the maximum divergence in the ion trajectory from the (desired) vertical direction (i.e., perpendicular relative to the surface of the wafer 120). The angular distribution of ions passing through the grid 108 is influenced not only by d/l, but also by the acceleration potential voltage on the grid 108. The higher the grid voltage, the more rapidly ions are pulled out of the plasma generation region (110) with near vertical trajectories, and therefore the narrower will be the angular distribution of the ions reaching the wafer 122. The divergence of the ion trajectory from true vertical (i.e., the angular distribution) determines the deposition rate on vertical side walls. By minimizing the divergence, the side wall deposition rate is minimized. By minimizing the side wall deposition rate, the tendency to pinch off HAR openings before they are filled is prevented.

In a CVD process for depositing a dielectric film such as silicon dioxide, the process gas supply 114a may furnish a silicon-containing gas such as silane or TEOS while the process gas supply 114b may furnish oxygen. The RF power of RF generator 126 is applied between two capacitive electrodes, namely the side wall 102 and the grid 108 in the example of FIG. 1, so that RF power is capacitively coupled to the process gases in the upper sub-chamber 110 to generate a plasma. The plasma in the upper sub-chamber 110 has many times more neutrals than ions. The attractive potential on the grid 108 attracts only ions in a vertical direction toward the grid 108, where many of them pass through the grid orifices 109, so that the ion content of plasma in the lower sub-chamber is greatly enriched. The gap or distance between the wafer 122 and the grid 108 is selected to be smaller than the ion-to-neutral mean collision distance in the lower chamber, to minimize scattering of the ions from their vertical trajectory. In this example, the plasma ions include silicon and oxygen ions, and possibly $SiH_x$ ions or other molecular ions, which combine on the surface of the wafer 122 for form a silicon dioxide film.

The aspect ratio d/l and diameter d of the grid orifices 109 are selected so that the gas conductance through the grid 108 is sufficiently limited to impose a significant pressure drop across the grid 108. For example, with a proper selection of the evacuation rate of the pump 118, the upper sub-chamber 110 may have a relatively high pressure conducive to efficient plasma ion generation (e.g., about 50 mT) while the lower sub-chamber 112 may have a relatively low pressure (e.g., from about 0.1 to about 1 mT) for a very large ion/neutral mean collision distance. This reduces scattering of the ions in the lower sub-chamber to minimize scattering-induced divergence of ion trajectory from the vertical direction, and also reduces ion losses due to recombination. At this lower pressure (0.1 mT), the wafer-to-grid gap may be in a range from about a fraction of a centimeter to ten's of centimeters and still be less than one-tenth of the ion/neutral mean collision distance. The result is that a very high proportion of particles incident on the wafer 122 are ions with trajectories that are sufficiently vertical to avoid collisions with side walls of HAR openings in the thin film structure on the wafer 122, and thereby avoid accumulation of deposited material on those side walls before the HAR openings are filled from the bottom. While the pressure drop in the foregoing example was between a factor of about five and ten but may be less (factor of four) or greater (factor of 20).

A CVD process for filling HAR openings in small geometry (e.g., 65 nm) devices avoids the problem of pinch off using the reactor of FIG. 1 by increasing the proportion in the lower sub-chamber 112 of ions or particles having a vertical trajectory (i.e., perpendicular to the surface of the wafer 122). This proportion is increased so that the deposition rate of ions or particles in the bottom of an HAR opening is sufficiently greater than the deposition rate on the side wall to prevent pinch-off at the top of the opening prior to the HAR opening being completely filled from the bottom. The proportion of ions having a vertical trajectory in the lower sub-chamber 112 is affected not only by the aspect ratio of the grid orifices 109 but also by the grid voltage applied by the source 124. As the grid voltage is increased, the flux of vertically travelling ions through the grid 108 increases due to the increasing acceleration potential. As this flux increases, the population in the lower sub-chamber 112 of vertically travelling ions increases relative to all other particles including ions or neutrals having non-vertical trajectories. Depending upon the device geometry and the HAR opening aspect ratio, the population of vertically travelling ions reaches a threshold at which pinch-off is prevented.

Therefore, in one aspect, a CVD process for filling HAR openings (aspect ratio >8) in small geometry thin film structures (65 nm or less) is carried out by increasing the attractive voltage on the grid 108 at least up to a threshold level at which pinch-off is prevented. This threshold lies between two extremes. At a lower extreme the grid voltage is zero, so that there is no attraction ions and there is a high proportion of ions and neutrals in the lower sub-chamber 112 having non-vertical trajectories, and therefore the greatest tendency to deposit on side walls and cause pinch-off. At the upper extreme, the grid voltage is so great that, in the lower sub-chamber 112, the ion trajectory angular distribution is extremely narrow (centered about the vertical direction) and the ion energy is so great that the ion density at the wafer surface can have a non-uniformity corresponding to the hole pattern in the grid 108. This latter extreme depends upon the spacing between adjacent orifices 109 in the grid 108.

The ion energy can be modified by changing the frequency of the grid voltage supply 124. For this purpose, the grid voltage supply 124 should produce an RF (sinusoidal) voltage waveform. As the frequency changes, the ability of the ions to follow the oscillations of the applied RF voltage changes. Specifically, as the frequency decreases, the ions are better able to follow the oscillations, so that at a sufficiently low frequency the ion energy distribution extends from zero to an energy corresponding to the peak-to-peak voltage of the grid voltage supply 124. As the frequency increases, however, the ability of ions to follow the oscillating RF voltage decreases until, at a sufficiently high frequency, the ions cannot follow the oscillations, and the ion energy distribution is narrowly confined to an energy corresponding to half the peak-to-peak voltage of the grid voltage supply.

In order to avoid excessive build-up of positive charge on the wafer 122, a source of negative charge neutralizes the surface of the wafer 122. This neutralizing source may be an electron source 130, such as an electron flood gun or a plasma source, or a source of an electron donor gas such as Zenon gas. Another source of electrons is the electrons scattered from the wafer surface by ion bombardment. These scattered electrons may be trapped and returned to the wafer surface by a magnet 140 underneath or inside of the wafer support pedestal 120. Since electrons are lighter than ions, the magnet 140 traps electrons nearer the wafer 122 than ions, and therefore provides a charge neutralizing effect. Another way of providing charge neutralization is to employ RF source power, such as the RF generator 126. Every half cycle, some electrons are attracted through the grid 108, contributing to charge neutralization.

The grid 108 is formed of a conductive material such as a metal (e.g., aluminum) or of a process-compatible material such as a semiconductor (e.g., silicon or silicon carbide, undoped or doped). Alternatively, the grid 108 may be formed of a metal (aluminum) and coated with a thin layer of a process compatible material (e.g., silicon or silicon carbide).

Internal coolant passages 408 may be provided in the grid 108 and/or in the insulator ring 132 supporting the grid 108. A temperature controller 410 pumps fluid through the coolant passages 408 and either cools the fluid or heats the fluid as needed. One purpose of the temperature controller 410 is to avoid excessive heating of the grid 108 which may otherwise cause the grid to distort or bend.

Internal coolant passages 409 may be provided in the wafer support pedestal 120. A temperature controller 411 pumps fluid through the coolant passages 409 and either cools the fluid or heats the fluid as needed. One purpose of the temperature controller 411 is to avoid excessive heating of the wafer 122.

The CVD processes performed by the reactor of FIG. 1 have been described with reference to deposition of silicon dioxide. However, the deposited layer may be another suitable material such as silicon nitride (using silane and nitrogen and/or ammonia process gases), silicon nitride hydride (using silane, nitrogen and hydrogen and/or ammonia process gases), fluoro-silicate glass (using silane, oxygen and fluorine-containing gases such as $CF_4$, $SiF_4$, or $NF_3$), phosporous silicate glass (using silane, oxygen and phosphorus-containing gases such as $PH_3$ or $PF_3$), boron silicate glass (using silane, oxygen and a boron-containing gas such as $B_2H_6$ or $BF_3$), silicon carbide-like material (using silane and a carbon-containing gas such as $CF_4$ or $CH_4$) or silicon hydride (using silane and optionally hydrogen). In the above examples, other sources of silicon, such as TEOS, may be used.

Figure 3:
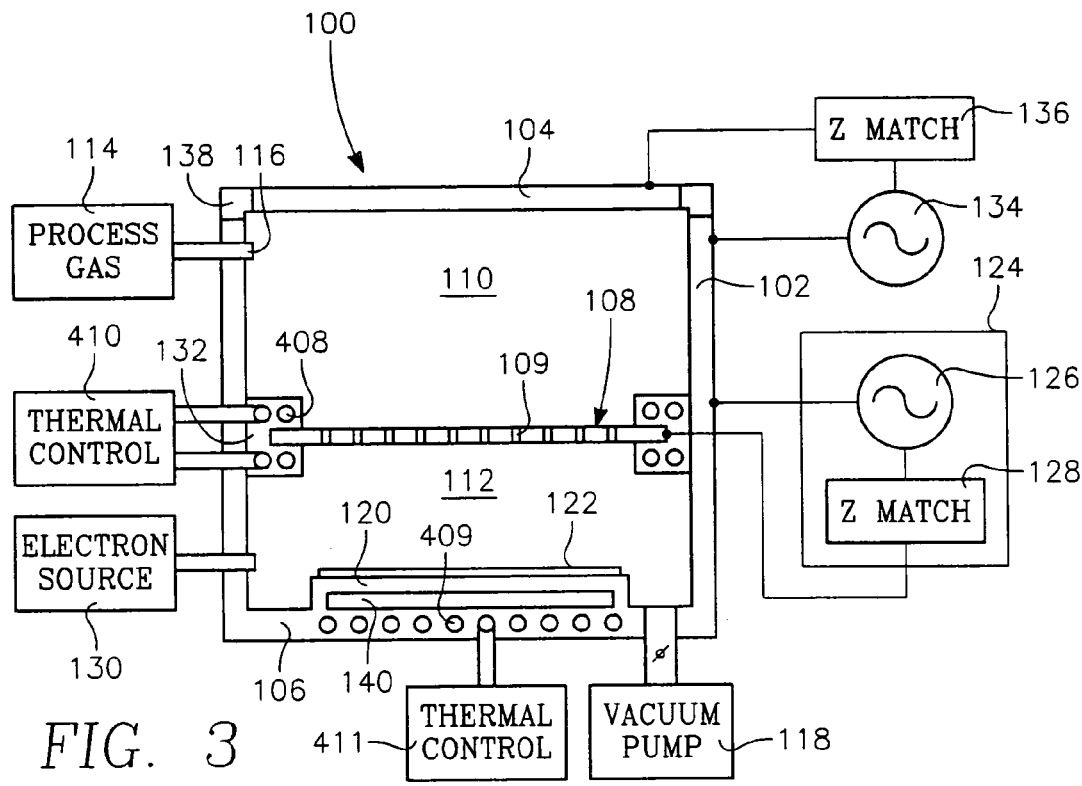
FIG. 3 illustrates a CVD reactor having a single ion shower grid and a capacitively coupled plasma source power applicator separate from the grid potential source.

Control of the grid voltage and the plasma source power may be decoupled by providing a plasma source power applicator separate from the voltage source 124 that drives the grid 108. For example, the plasma source power applicator may be a capacitively coupled one. As shown in FIG. 3, the capacitively coupled plasma source power applicator consists of an electrode (the ceiling 104) driven by an RF plasma source power generator 134 through an impedance match circuit 136, and a counter electrode (the side wall 102) coupled to the return terminal of the generator 134. The ceiling 104 and side wall 102 are insulated from one another by a dielectric ring 138. RF power from the source power generator 134 is capacitively coupled to the process gases in the upper sub-chamber 110. The source power generator 134 may produce either a pulsed output or a sinusoidal output or a combination of both, as will be discussed below, and may provide very high power, such as 5 kwatts, for example. Alternatively, the grid voltage supply 124 and the source power generator 134 may both deliver RF power but at different frequencies. As one example, the source power generator 134 may have an HF or VHF frequency, while the grid voltage supply 124 may have a low frequency (LF) output. As another possibility, the grid voltage supply 124 may simply set the grid potential at ground.

Figure 4:
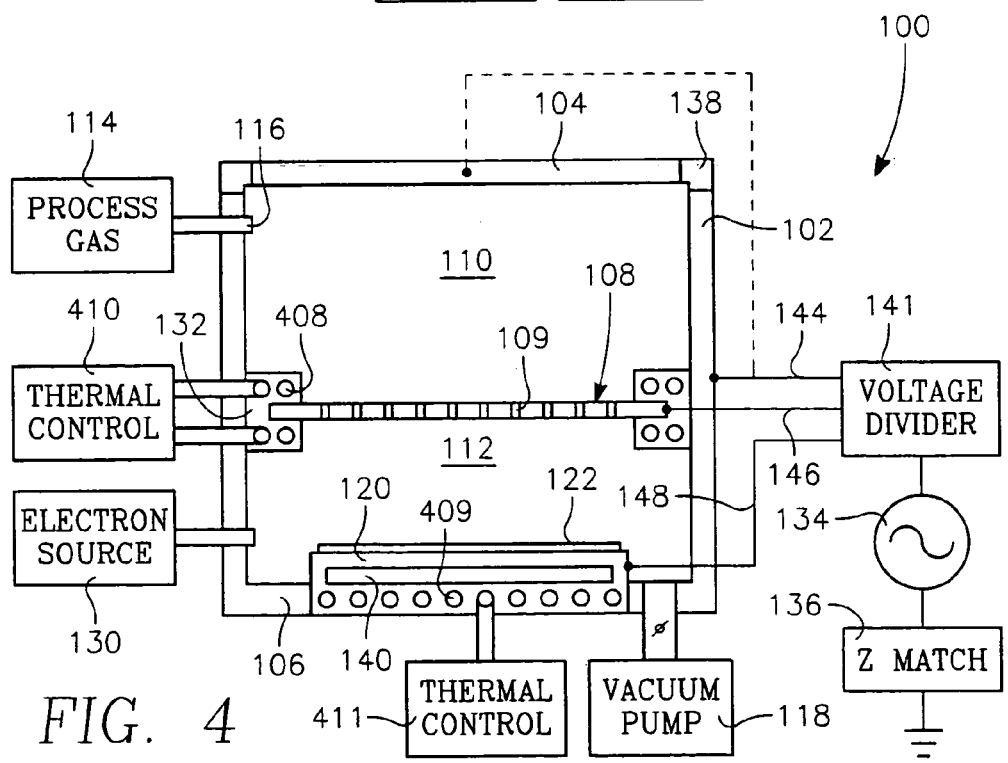
FIG. 4 illustrates a CVD reactor having a single ion shower grid, a capacitively coupled plasma source power applicator and a voltage divider for applying successive potentials from a potential source to the plasma, the ion shower grid and the wafer.

An attractive potential drop extending from the plasma in the upper sub-chamber 110 through the grid 108 all the way to the wafer 122 may be established by applying progressive voltages from the voltage source 124 to the side wall 102, the grid 108 and the wafer support pedestal 120, so that the side wall 102 is at the most positive potential, the grid is at a less positive potential and the wafer is at the ground of the voltage source 124. For this purpose, a voltage divider 141 shown in FIG. 4 may be employed. FIG. 5 illustrates an implementation of the voltage divider 141 as an inductive circuit. The output of the generator/impedance match 134, 136 is connected across an inductor 142. The inductor has a high voltage tap 144 connected to the side wall 102 or to the ceiling 104, an intermediate voltage tap 146 connected to the grid 108 and a bottom tap 148 connected to the wafer support 120 or ground. FIG. 6 illustrates an alternative implementation of the voltage divider 141 as a resistive circuit. In FIG. 6, the output of the generator/impedance match 134, 136 is connected across a resistor 152. The resistor has a high voltage tap 154 connected to the side wall 102, an intermediate voltage tap 156 connected to the grid 108 and a bottom tap 158 connected to the wafer support 120 or ground. Alternatively, three separate voltage generators could be connected, respectively, to the side wall 102, the grid 108 and the wafer support 120, their respective voltages being arranged to provide attractive potential differences from the plasma to the grid 108 and from the grid 108 to the wafer 122.

FIG. 7A depicts the time domain waveform of a 5 kV pulsed D.C. voltage that can be applied to the grid 108 by the voltage source 124. FIG. 7B illustrates the time domain waveform of an RF voltage (e.g., about 100 Volt peak) furnished by the plasma source power generator 134 to generate plasma in the upper sub-chamber 110. FIG. 7C illustrates the combined effect of the voltages from the grid voltage source 124 and the RF plasma source power generator 134 on the plasma potential in the upper chamber, the plasma potential being the sum of the two voltage waveforms.

Figure 8:
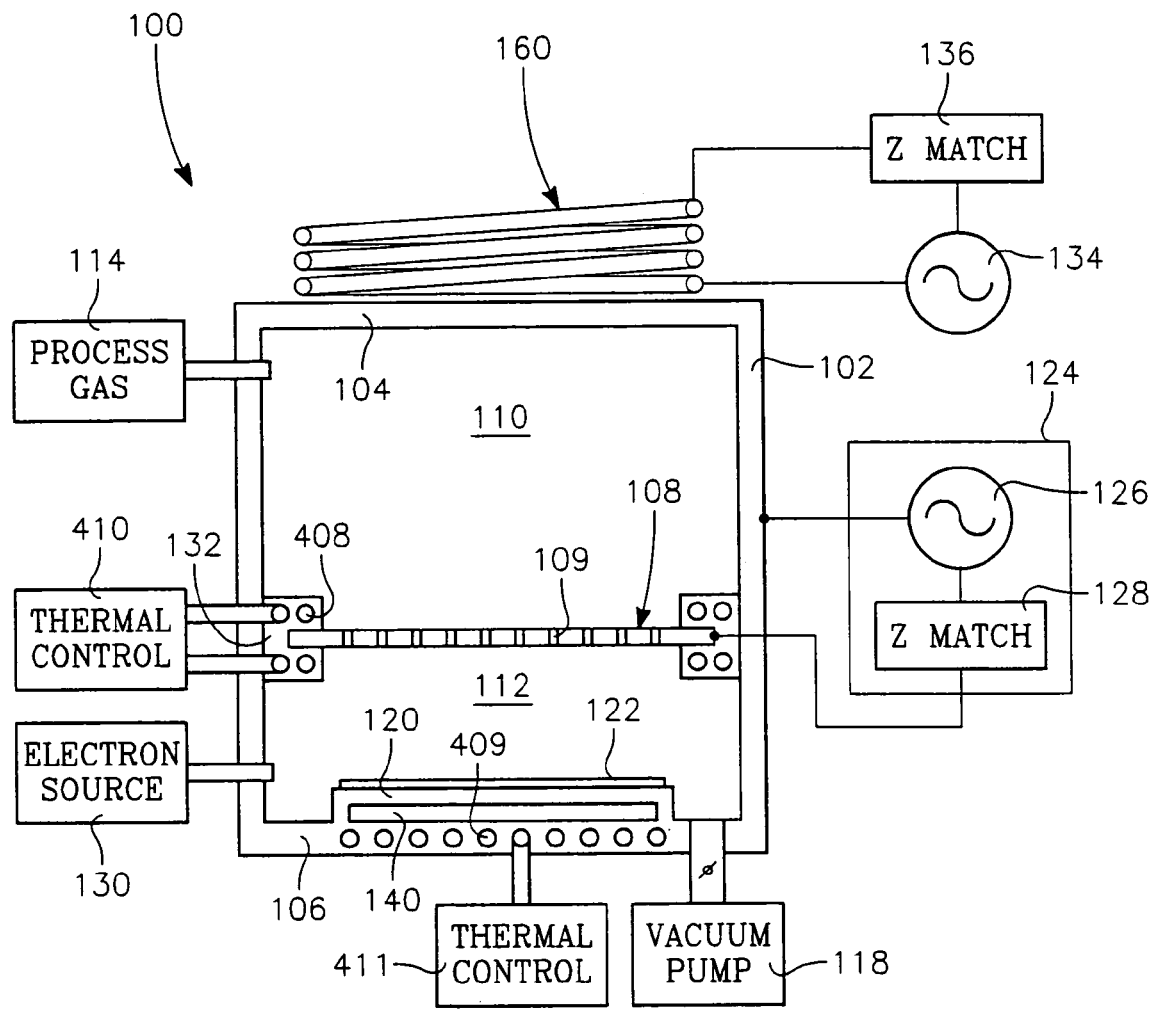
FIG. 8 illustrates a CVD reactor having a single ion shower grid and an inductively coupled plasma source power applicator separate from the grid potential source.

FIG. 8 illustrates the use of an inductively coupled plasma source power applicator to generate a plasma independently of the grid voltage supply 124. The inductively coupled plasma source power applicator is a coil antenna 160 driven by the RF source power generator 134 through the impedance match circuit 136. One advantage of the inductively coupled source power applicator is that it is capable of producing higher plasma ion density than the capacitively coupled version of FIG. 4, so that the interaction of the grid with the plasma will produce a greater proportion of particles that have a vertical trajectory and which are therefore better adapted for filling HAR openings of small geometry (65 nm) devices.

Figure 9A:
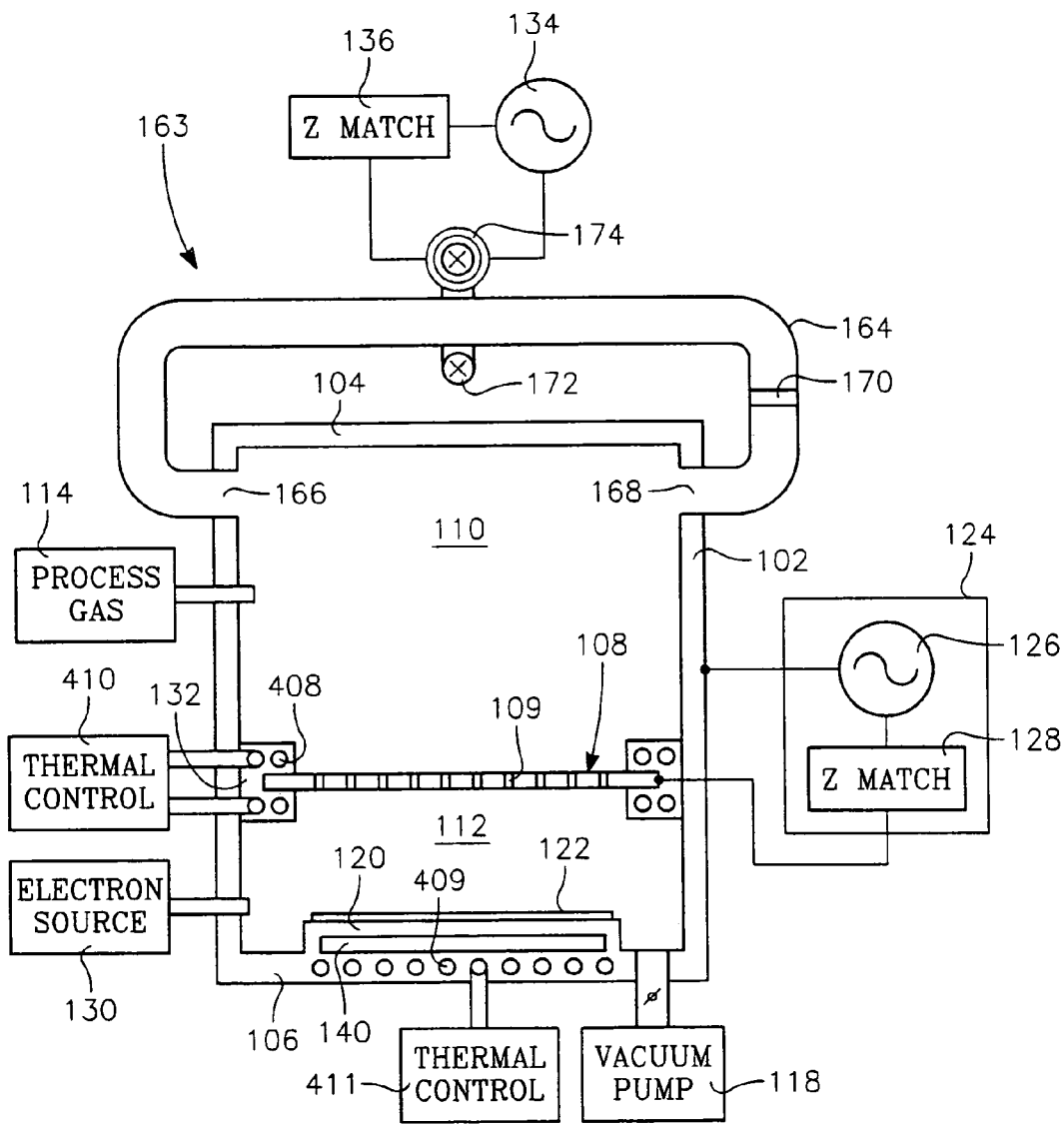
FIG. 9A illustrates a CVD reactor having a single ion shower grid and a toroidal plasma source power applicator independent of the grid voltage source.

FIG. 9A illustrates the use of a torroidal plasma source power applicator 163 to generate plasma independently of the grid voltage supply 124. The torroidal plasma source power applicator 163 may be of the type disclosed in U.S. patent application Ser. No. 10/646,533, filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE by Kenneth S. Collins et al. and assigned to the present assignee. The torroidal plasma source power applicator 163 consists of at least one reentrant hollow external conduit 164 connected to opposite sides of the upper chamber 110 at opposing openings or ports 166, 168. The conduit 164 can be conductive and includes a D.C. break 170 filled by an insulating ring. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

The torroidal plasma source of FIG. 9A can maintain a plasma using very low source power (e.g., about 100 watts) and induces a much smaller plasma potential than other source power applicators. This characteristic is exploited to great advantage in embodiments described later in this specification.

Figure 9B:
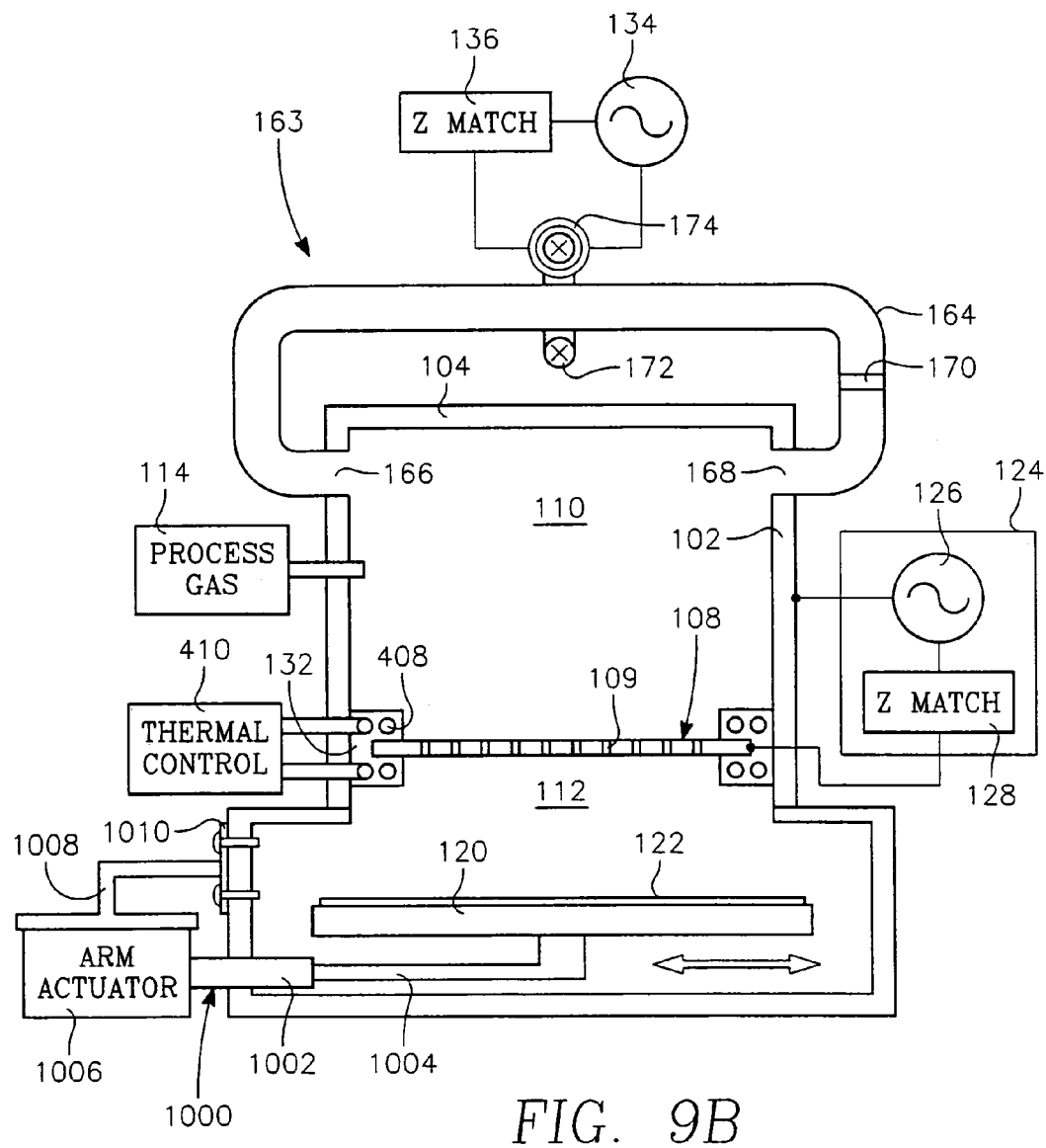
FIG. 9B illustrates a modification that enables the beam or wafer to be scanned relative to one another.

FIG. 9B illustrates a modification which may be made to any of the plasma reactors described in this specification. In the modification of FIG. 9B, the process sub-chamber 112 has a diameter greater than that of the ion generation sub-chamber 110 and greater than that of the ion shower grid 108. The wafer support pedestal 120 has a correspondingly greater diameter so that it can accommodate a larger wafer 122. In order to achieve uniform distribution of ion flux from the ion shower grid 108 across the surface of the wafer 122, the wafer support pedestal 120 and the ion generation region 110 translate relative to one another. In one implementation, the wafer support pedestal 120 is mounted on a movable telescoping arm 1000 having an outer sleeve 1002 and a sliding rod 1004 within the sleeve 1002 for movement for left/right movement in the view of FIG. 9B. A second movable telescoping arm (not shown) can be provided to lateral movement in the same plane but transverse to the left/right movement direction of the telescoping arm 1000. The movement and telescoping of the arm 1000 is controlled by an arm actuator 1006. The actuator 1006 may be mounted to the chamber housing by a fixed rack 1008 and base 1010 bolted to the side wall of the reactor, for example. This feature permits wafers of any size to be processed in the reactor without regard to the diameter of the ion shower grid 108. For example, the drawing of FIG. 9B illustrates an over sized wafer 122 in an oversize process sub-chamber 112. This feature may be added to any of the embodiments described herein.

Another feature which may be implemented using the actuated arm 1000 is to tilt the wafer support pedestal so that different angles of incidence may be obtained for the ion beam relative to the top surface of the wafer 122. For this purpose, the arm 1000 may have sufficient articulation to tilt the wafer support pedestal 120 in any direction as desired. Or, it may tilt it in one direction and then rotate it about the axis of symmetry of the chamber. This feature may be carried out in any of the embodiments described herein.

Figure 10:
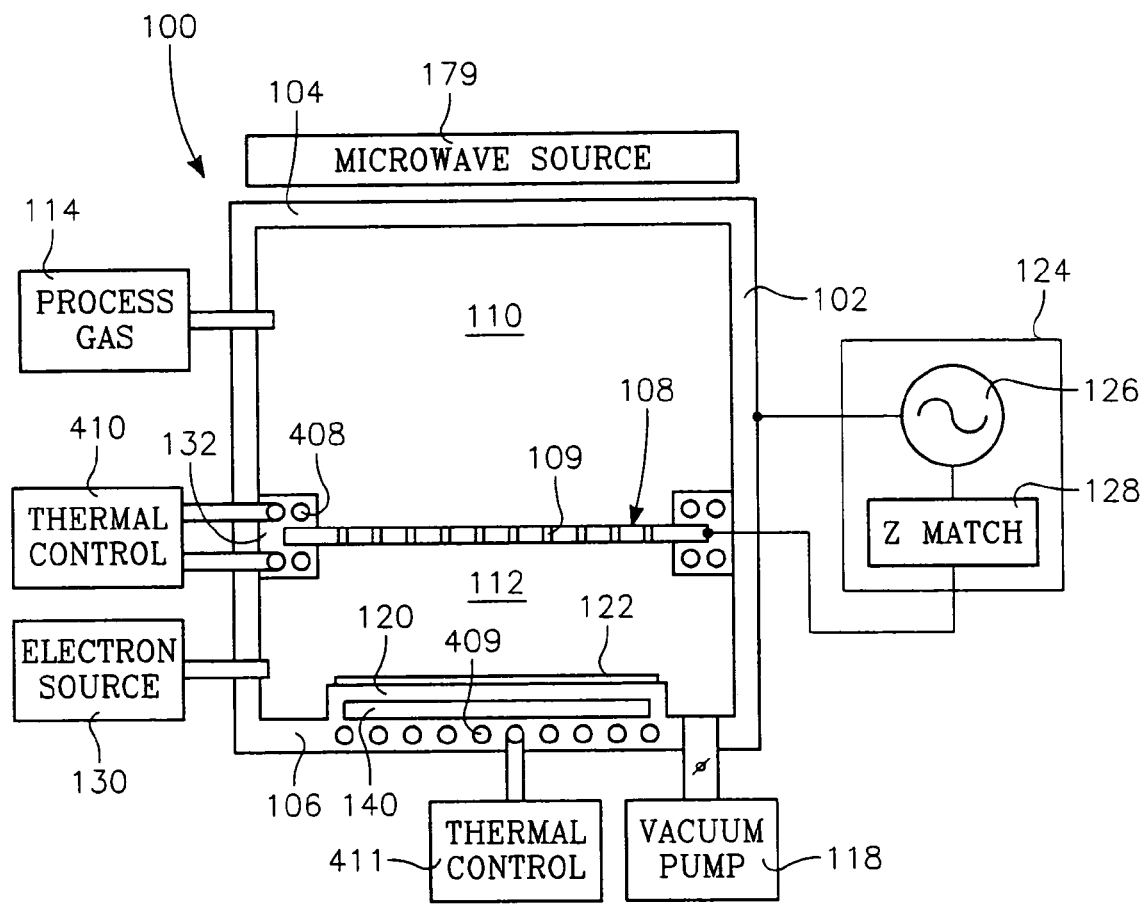
FIG. 10 illustrates a CVD reactor having a single ion shower grid and a microwave plasma source power applicator separate from the grid voltage source.

FIG. 10 illustrates the use of a microwave plasma source power applicator 179 to generate plasma in the upper sub-chamber 110 independently of the grid voltage supply 124.

Figure 11:
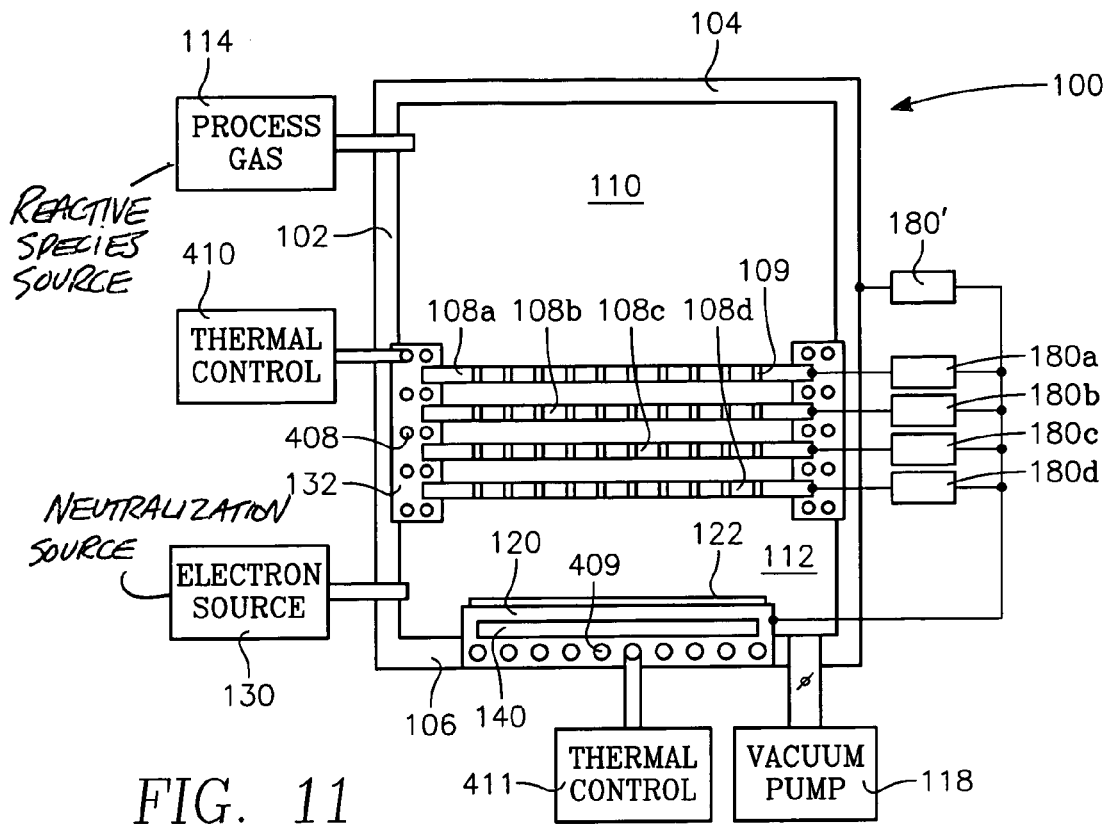
FIG. 11 illustrates a CVD reactor having multiple parallel ion shower grids and multiple grid voltage sources.

Referring to FIG. 11, the single grid 108 may be replaced by multiple conductive grids 108a, 108b, 108c, 108d, each having the same structure as the grid 108 of FIG. 1 and stacked in parallel fashion. While FIG. 11 illustrates an embodiment having four parallel stacked ion shower grids 108a-108d, any other suitable number of multiple grids may be chosen, such as two or three or more than four. The openings 109 of successive grids 108a-d are in registration to promote a vertical ion trajectory profile through the multiple grids 180a-d. The multiple grids 108a-d may be driven by a single power source through a multiple tap voltage divider network (like the voltage divider network of 141 of FIG. 5). However, rather than a single voltage source, FIG. 11 illustrates an implementation employing multiple voltage sources: the plasma is driven by a voltage source 180' coupled to an interior conductive surface (102 or 104) of the upper sub-chamber 110; the multiple grids 108a, 108b, 108c, 108d are driven by separately controlled voltage sources 180a, 180b, 180c, 180d, respectively. The upper portion of the side wall 102 facing the upper sub-chamber 110 may be electrically insulated from the portion of the side wall 102 facing the lower sub-chamber 112.

As in the embodiment of FIG. 1, the voltage difference between the upper chamber surface (102 or 104) and the grid 108a produces an attractive grid potential to plasma ions as well as plasma source power for the upper sub-chamber 110. For this purpose, the top grid 108a and the upper chamber surface (102 or 104) act as counter electrodes to one another, and serve to capacitively couple power into the upper sub-chamber 110. The grid voltage sources 180a, 180b, 180c, 180d are connected to respective ones of the grids 108a, 108b, 108c, 108d. While FIG. 11 illustrates an example employing four conductive grids, the number may vary from two grids to more than four grids. As in the single grid 108 of FIG. 1, each of the multiple grids 180a-d of FIG. 11 may be formed of a metal (e.g., aluminum) or of a process-compatible material (e.g., silicon carbide) or may be a metal coated with a thin layer of a process-compatible material.

The drawing of FIG. 11 shows that the voltage sources 180', 180a-180d are referenced to the wafer support pedestal 120. However, they may be referenced in a different manner. The wafer support pedestal may be grounded or it may have a floating potential.

Figure 12A:
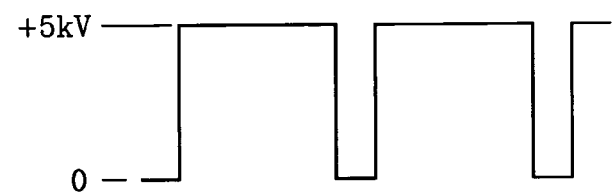
FIGS. 12A, 12B, 12C, 12D and 12E illustrate contemporaneous time domain waveforms of grid voltages applied to successive ones of the multiple grids of FIG. 11.
Figure 12B:
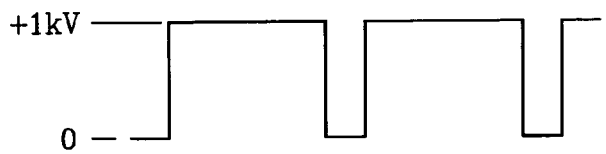
Figure 12C:
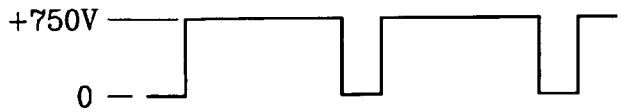
Figure 12D:
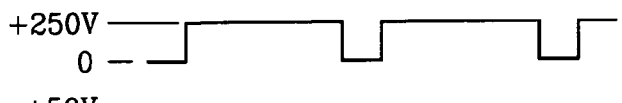
Figure 12E:
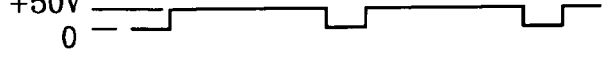

FIGS. 12A through 12E illustrate one way of operating the multiple grids 108a-d so as to distribute the total potential difference between the plasma and the grid voltage among the multiple grids 108a-d. FIGS. 12A through 12E represent the time domain pulsed positive voltages of, respectively, the voltage sources 180', 180a, 180b, 180c, 180d. In FIG. 12A, ions are presented with ever-increasing attractive potentials (relative to the plasma potential of FIG. 12A) starting with the top grid 180a (with the greatest positive voltage) and progressing down to the bottom grid 180d (having the least positive voltage). The voltage sources may generate pulsed D.C. voltages or RF voltages or a combination of both.

FIGS. 13A through 13E illustrates a mode of operating the multiple grids 108a-d in which different grid voltages are employed to focus ion trajectories toward the center of each grid orifice 109 in selected ones of the multiple grids 108a-d, so as to minimize or prevent ion collisions with grid surfaces. In the illustrated example, voltages of alternating polarities are applied to the succession of multiple grids 108a-d shown in FIG. 13A. FIGS. 13B through 13E illustrate the contemporaneous time domain voltage waveforms applied to the individual grids 108a through 108d respectively. The voltage waveforms depicted in FIGS. 13B through 13E are relative to the plasma potential and are peak values, and are provided as tutorial examples only. The top grid 108a is given a small positive (repulsive) voltage (e.g., 10 Volts), while the next grid 180b is given a large negative (attractive) voltage (e.g., −500 Volts). The third grid 108c is given a small positive (repulsive) voltage and the bottom grid 108d is given a large negative (attractive) voltage. The electric fields formed between the grids tend to focus ion trajectories toward the centers of the grid orifices 109. The resulting ion paths are indicated in simplified fashion in FIG. 13A.

An alternative mode of operating the multiple grids 108a-108d is to use the upper grids 108a-108c to accelerate ions from the ion generation sub-chamber 110 through the grid structure as described above, but use the bottom grid 108d as a neutralizer grid to at least partially (if not fully) neutralize the ion beam to create a beam of neutrals incident on the wafer 120. For this purpose, the bottom "neutralizer" grid 108d would have it orifices with exceptionally large aspect ratios and narrow diameters. Furthermore, a suitable neutralizing potential (e.g., ground) could be applied to the grid 108d.

While the number of multiple grids in the illustrated implementation is four, any suitable number of plural grids may be employed.

Figure 14:
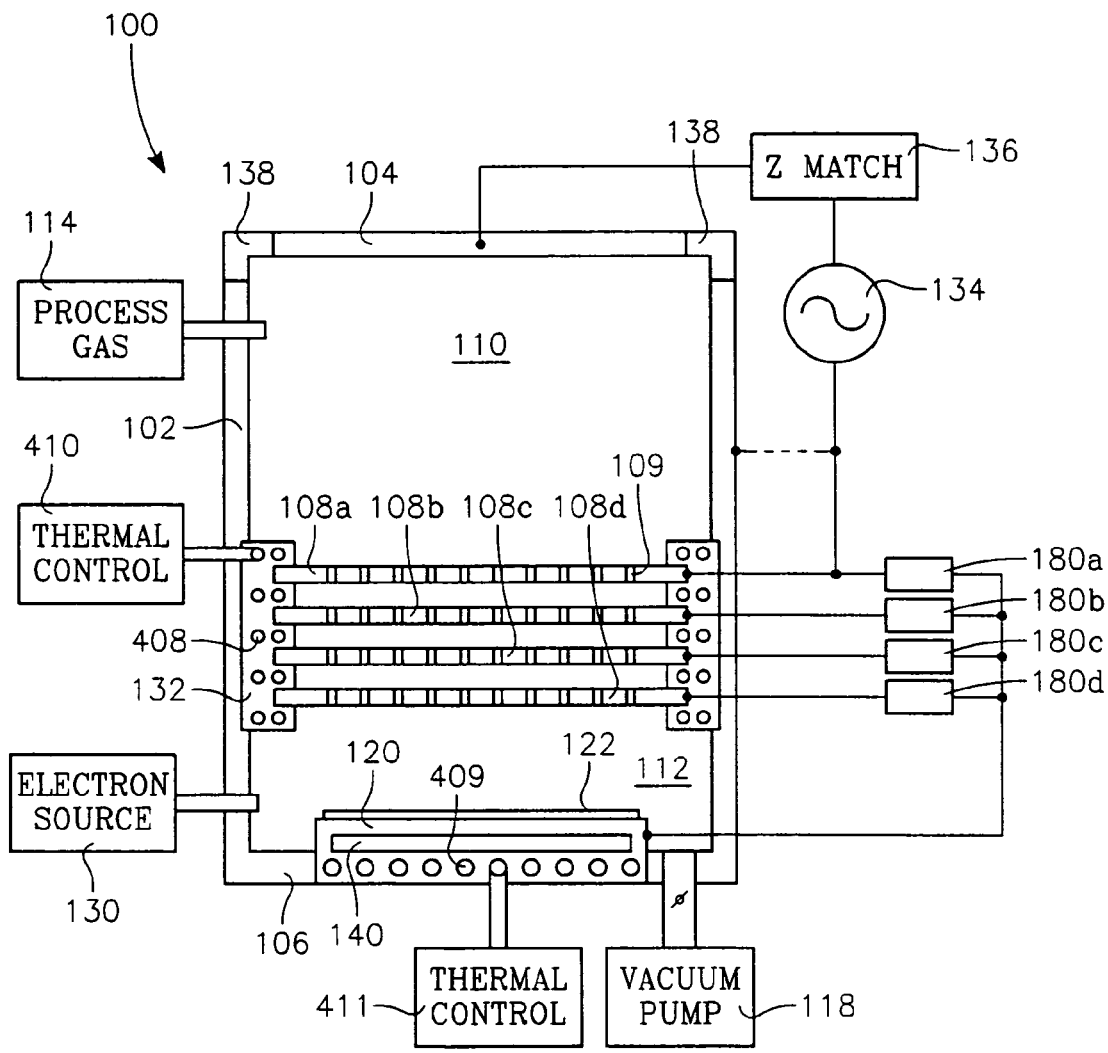
FIG. 14 illustrates a CVD reactor having multiple parallel ion shower grids and multiple grid potential sources and a capacitively coupled plasma source power applicator separate from the grid potential sources.

FIG. 14 illustrates a reactor including the multiple grids 108a through 108d and their voltage sources 180a through 180d, in combination with a capacitively coupled plasma source power applicator that is independent of the grid voltage sources 180a-180d. The capacitively coupled plasma source power applicator includes the top grid 108a and the ceiling 104 as counter electrodes and an RF plasma source power generator 134 connected across the counter electrodes (i.e., the ceiling 104 and the top grid 108a) through an impedance match circuit 136. The top grid 108a is in contact with the plasma in the upper sub-chamber 110, and the plasma potential in the reactor of FIG. 14 is controlled by the voltage on the top grid 108a. The plasma potential is the sum of the grid voltage from the first grid voltage source 180a plus the voltage coupled to the plasma from the RF plasma source power generator 134. In one example, the grid voltage on the first grid 108a was about 5 kV pulsed D.C. and the plasma source power generator produced an RF voltage of about 1000 Volts. Alternatively, as indicated in dashed line, the source power generator 134 may be connected through the impedance match circuit across the ceiling 104 and side wall 102 instead of the top grid 108a.

Figure 15:
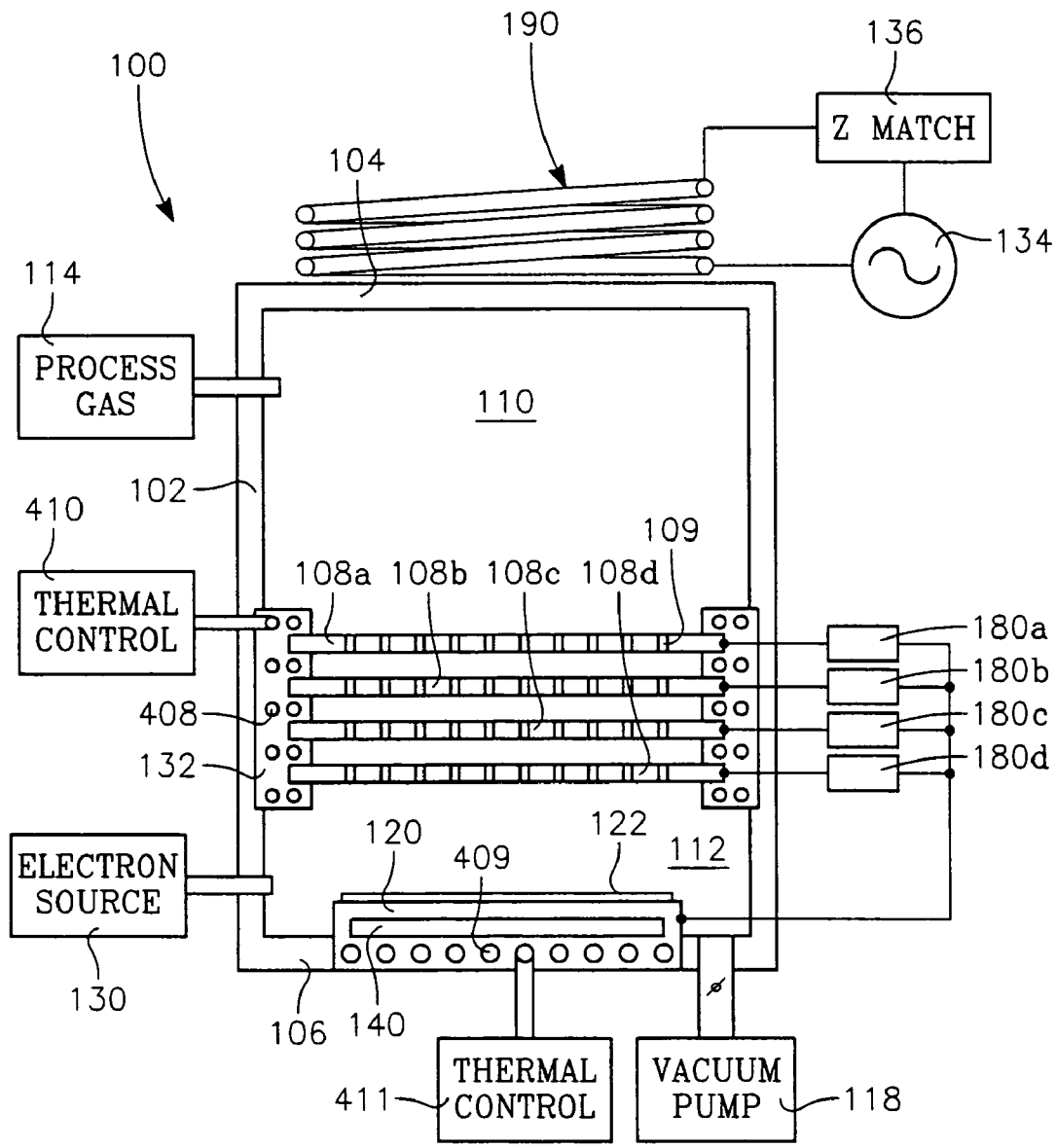
FIG. 15 illustrates a CVD reactor having multiple parallel ion shower grids and multiple grid potential sources and an inductively coupled plasma source power applicator separate from the grid potential sources.

FIG. 15 illustrates a reactor including the multiple grids 108a through 108d in combination with an inductively coupled plasma source power applicator that is independent of the grid voltage sources 180a-180d. The inductively coupled plasma source power applicator includes a coil antenna 190 overlying the ceiling 104, and an RF plasma source power generator 134 connected across the coil antenna 190 through an impedance match circuit 136.

Figure 16:
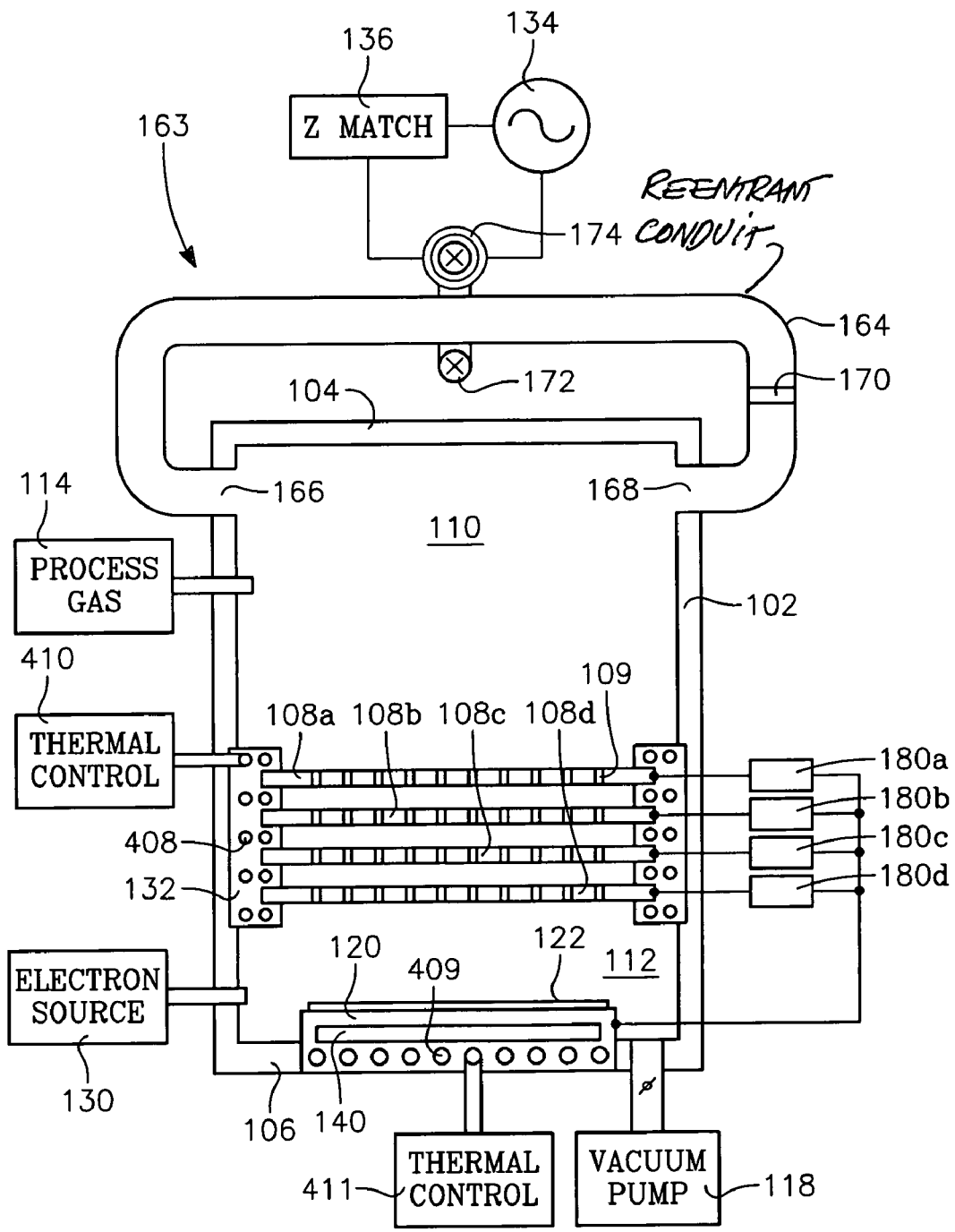
FIG. 16 illustrates a CVD reactor having multiple parallel ion shower grids and multiple grid potential sources and a toroidal plasma source power applicator separate from the grid potential sources.

FIG. 16 illustrates a reactor including the multiple grids 108a through 108d and their voltage sources 180a-180d in combination with a toroidal plasma source power applicator 163 that is independent of the grid voltage sources 180a-180d. The toroidal plasma source power applicator 163 consists of at least one reentrant hollow external conduit 164 connected to opposite sides of the upper chamber 110 at opposing openings or ports 166, 168. The conduit 164 can be conductive and includes a D.C. break 170 filled by an insulating ring. The toroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 17:
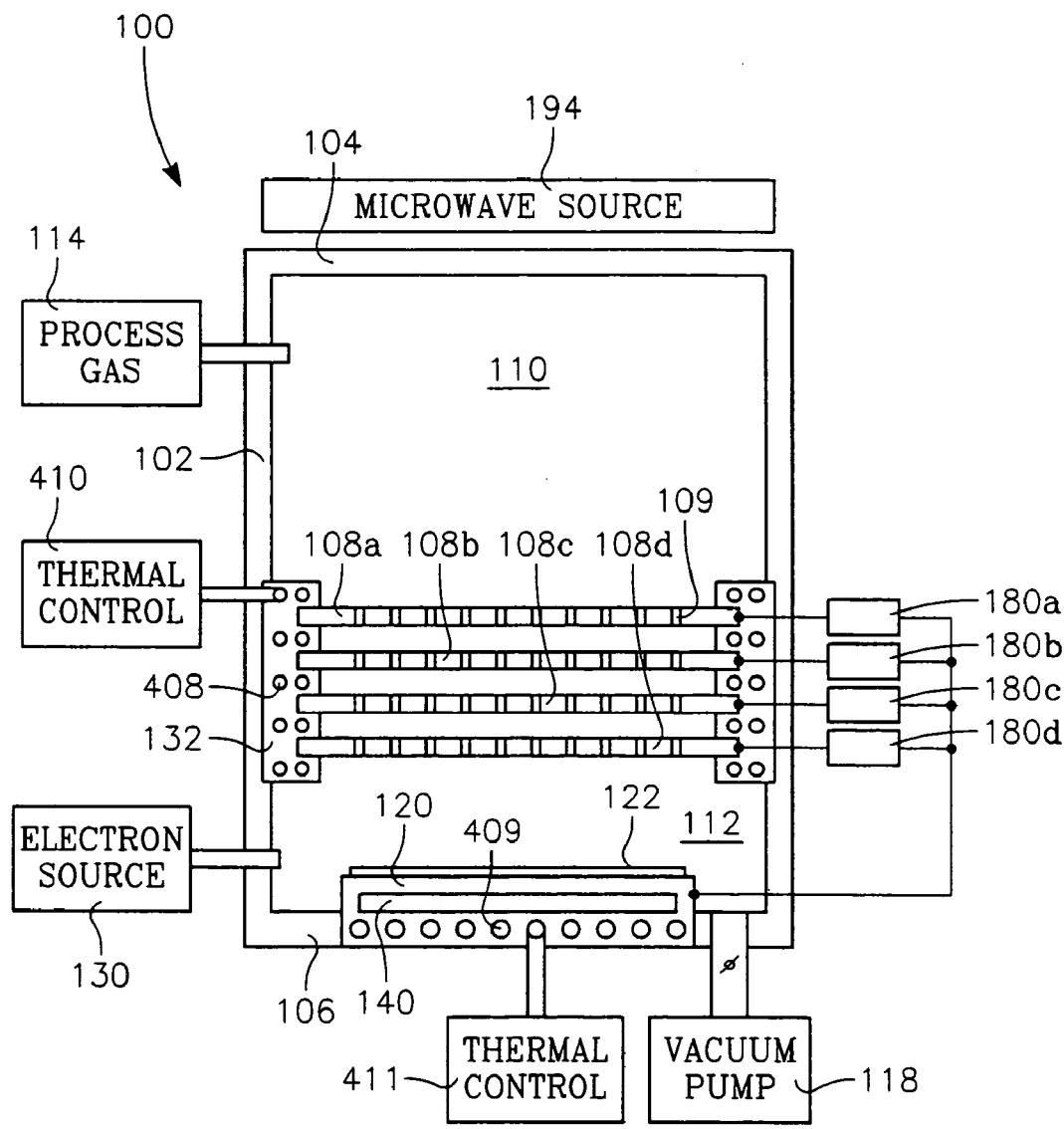
FIG. 17 illustrates a CVD reactor having multiple parallel ion shower grids and multiple grid potential sources and a microwave plasma source power applicator separate from the grid potential sources.

FIG. 17 illustrates a reactor including the multiple grids 108a through 108d in combination with a microwave plasma source power applicator 194 that is independent of the grid voltage sources 180a-180d.

Figure 18:
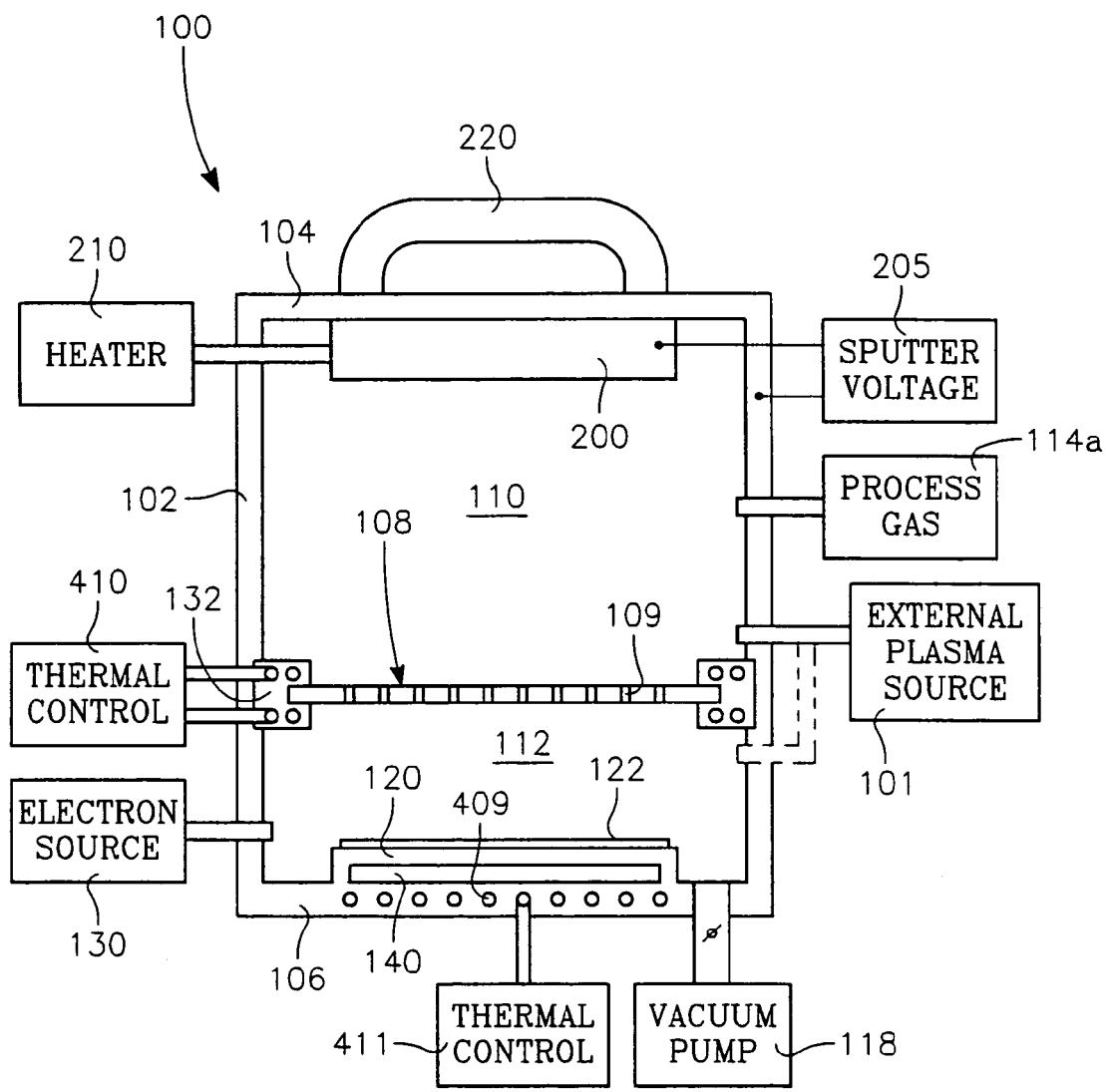
FIG. 18 illustrates a reactive ion sputter deposition reactor having a single ion shower grid.

FIG. 18 illustrates a reactor corresponding to that of FIG. 1, except that the deposition species are not obtained by ionization, but rather by sputtering in the upper sub-chamber 110. The deposition precursor species are therefore provided mostly as neutral atoms. The grid 108 does not attract ions but rather collimates the neutral atoms as they pass from the higher pressure upper sub-chamber 110 to the lower pressure sub-chamber 112. In the example of FIG. 18, the sputtering target is a wafer or block 200 near the chamber ceiling 104, sputtering of the target furnishing a deposition precursor species in atomic form. The target, wafer or block 200 is comprised of the deposition precursor species, which may be a semiconductor material such as silicon or silicon carbide, for example, or other compounds of silicon. Sputtering is produced by a sputter voltage source 205 connected across the sputter target 200 and the chamber side wall. The sputter voltage source 205 may generate a relatively high voltage (e.g., 5000 Volts), and may be a D.C. or pulsed or RF source. In the case of a silicon target, if the sputter voltage source 205 generates an RF voltage, then the frequency can be made to be sufficiently great to ensure capacitive coupling of power throughout the silicon block or wafer 200 so that it is more uniformly sputtered. A sputtering gas (such as an inert species like Argon) is introduced from the gas supply 114a. A heater 210 can maintain the temperature of the silicon target 200 at a suitably elevated temperature. The sputtering process is enhanced by including a magnet 220 overlying the ceiling directly above the silicon target 200. The magnet 220 promotes bombardment of the target by ions generated by the electric filed imposed by the high voltage source 205.

In order to deposit silicon dioxide, oxygen must be introduced into the reactor chamber 100. In one case, a gas supply 215 and an inlet 217 provides the oxygen gas into the lower sub-chamber 112 near the wafer 120. In another case, the gas supply 215 furnishes oxygen instead of Argon, so that the oxygen gas is the sputtering gas as well as a deposition precursor species. Alternatively, ozone may be employed instead of or in addition to the oxygen gas. The oxygen or ozone ions dissociate to oxygen atoms and the oxygen and silicon atoms combine on the surface of the wafer 122 to form silicon dioxide.

The grid 108 collimates the silicon atoms (and oxygen atoms) as they drift from the upper sub-chamber 110 into the lower sub-chamber 112 so that their trajectories have a narrow angular distribution centered about the vertical direction. This enables the silicon and oxygen atoms to reach the bottom of HAR openings in small geometry devices instead of being deposited on the vertical side walls of the openings. As a result, HAR openings are filled from the bottom with CVD-deposited silicon dioxide before pinch-off can occur. This process may be referred to as reactive physical vapor deposition (PVD). Since the collimated particles are mostly neutral, the grid 108 in the embodiment of FIG. 18 is not connected to any electrical source.

One advantage the reactive PVD process performed by the reactor of FIG. 18 is that the source is pure. There is a minimal amount of extraneous species, such as hydrogen. For example, in CVD processes employing silane and oxygen gases, for every atom of silicon that is deposited on the wafer, four atoms of hydrogen are dissociated into the plasma. This increases the gas pressure for a given amount of silicon in the plasma. In the reactive PVD process, however, there are no extraneous species, the only species present being silicon and oxygen, both of which are constituents in the deposited layer. This opens the process window with respect to chamber pressure and furthermore reduces unproductive reactions with extraneous species. In order to provide another source of oxygen, the target 200 may be silicon dioxide rather than silicon.

While the example of silicon dioxide deposition is discussed with reference to the reactor of FIG. 18, other materials may be deposited. For example, silicon nitride may be deposited, in which case the target 200 is a silicon wafer while the gas is nitrogen instead of oxygen. Or, a hydride of silicon nitride may be deposited, using a silicon target 200, nitrogen gas and hydrogen gas. In all of the foregoing examples, no extraneous species are introduced into the plasma, with the exception of Argon atoms in the case in which Argon is employed as the sputtering species.

Figure 19:
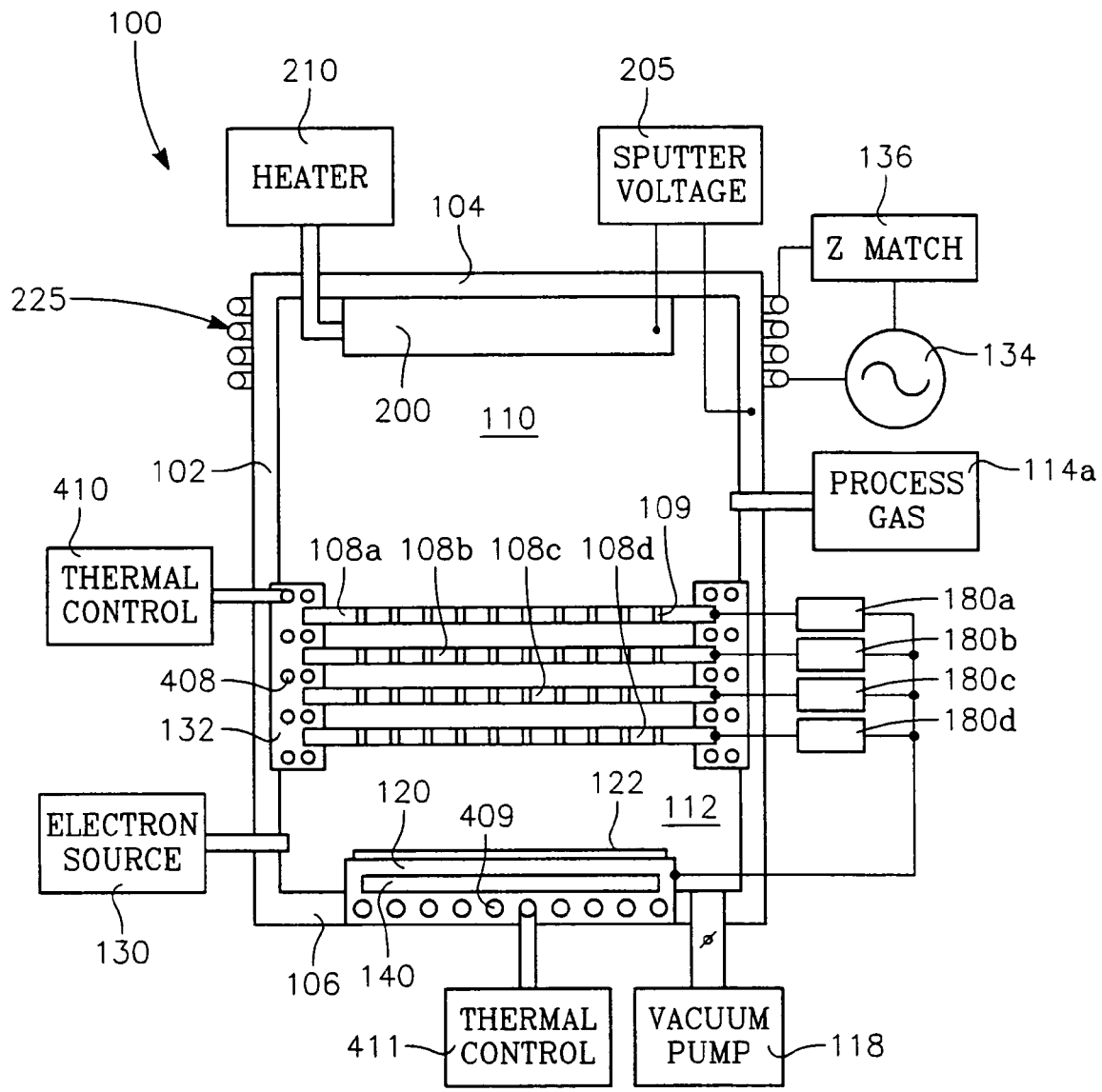
FIG. 19 illustrates a CVD reactor having an ion sputter source, multiple ion shower grids and an inductively coupled plasma source power applicator.

Performance of the reactor of FIG. 18 may be enhanced by providing a plasma source power applicator to ionize the gas and the silicon atoms sputtered from the target 200. In the case of a pure oxygen gas, this provides a plasma containing only silicon and oxygen. FIG. 19 illustrates a PVD reactor having the features of FIG. 18 and further having an inductively coupled plasma source power applicator consisting of a coil antenna 225 driven by an RF source power generator 230 through an impedance match circuit 235. In the implementation of FIG. 19, the coil antenna 225 is located along the chamber side wall 102 so that the target 200 does not shield the antenna 225 from the chamber interior. Alternatively, the target 200 may be a semiconductor material with a selected conductivity that permits inductively coupling through the target 200 at the frequency of the RF generator 134, so that the antenna may be located on the ceiling 104. As a further alternative, the coil antenna 225 may be located inside the reactor chamber below the target 200. Since the inductively coupled source power applicator can produce a relatively high density plasma, great advantage can be gained by driving the grid(s) 108 with a voltage attractive to ions in the plasma, as in the embodiment of FIG. 3. Specifically, the grid voltage(s) can be adjusted to narrow the angular distribution of ion trajectory about the vertical direction to enhance the filling of HAR openings in small geometry devices. FIG. 19 shows that instead of a single grid, multiple grids 108a through 108d may be used driven by respective grid voltage sources 180a through 180d. If only a single grid is present or if the multiple grids 108a-108d are used, they may be operated in the same manner as described above with reference to FIGS. 1-17.

Figure 20:
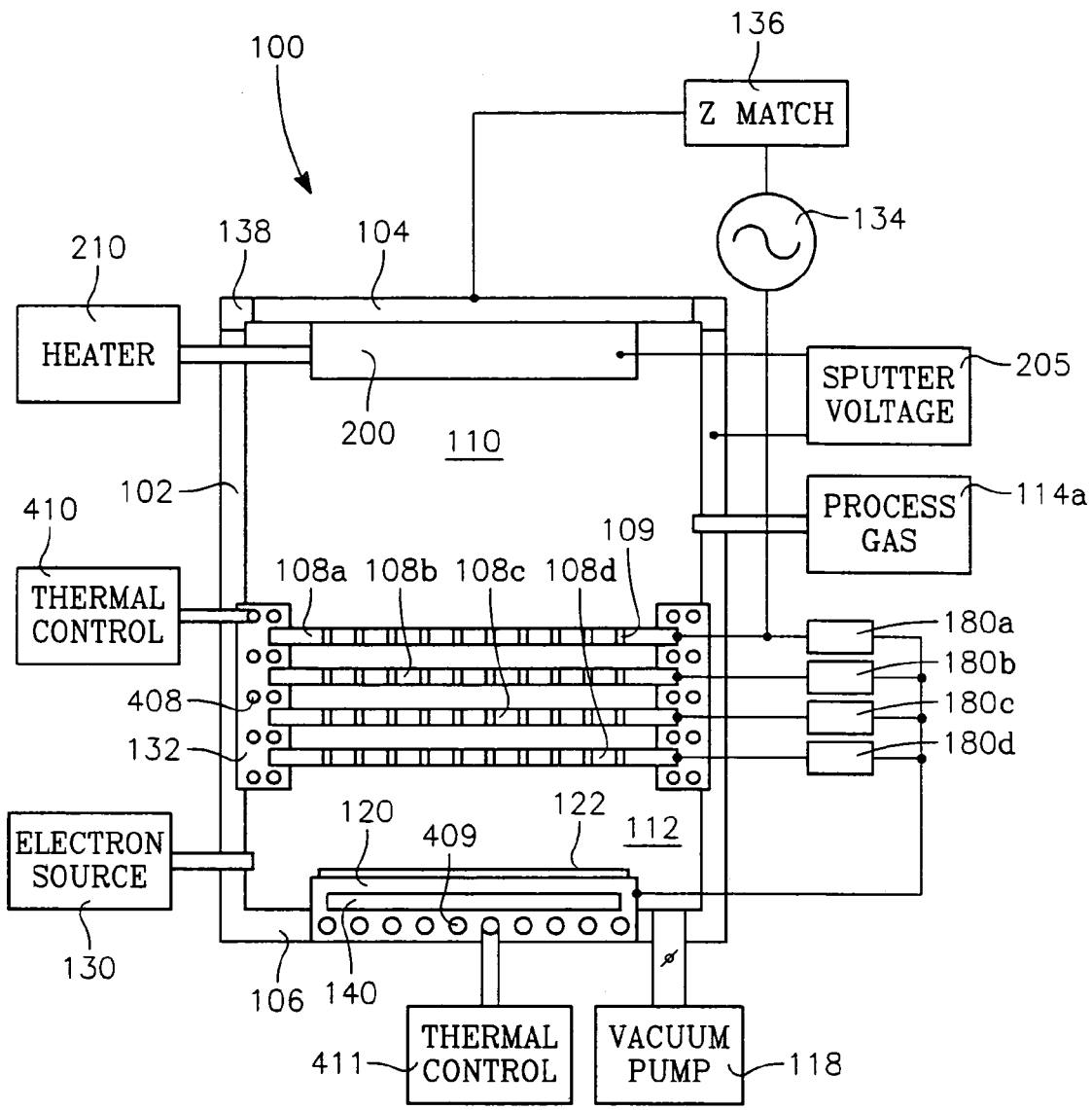
FIG. 20 illustrates a CVD reactor having an ion sputter source, multiple ion shower grids and a capacitively coupled plasma source power applicator.

FIG. 20 illustrates the combination of a reactive PVD reactor of the type illustrated in FIG. 18 further having multiple grids 108a-108d and a capacitively coupled plasma source power applicator. The capacitive source power applicator includes the ceiling 104 and the top grid 108a functioning as counter electrodes driven by the RF plasma source power generator 134 through the impedance match circuit 136.

Figure 21:
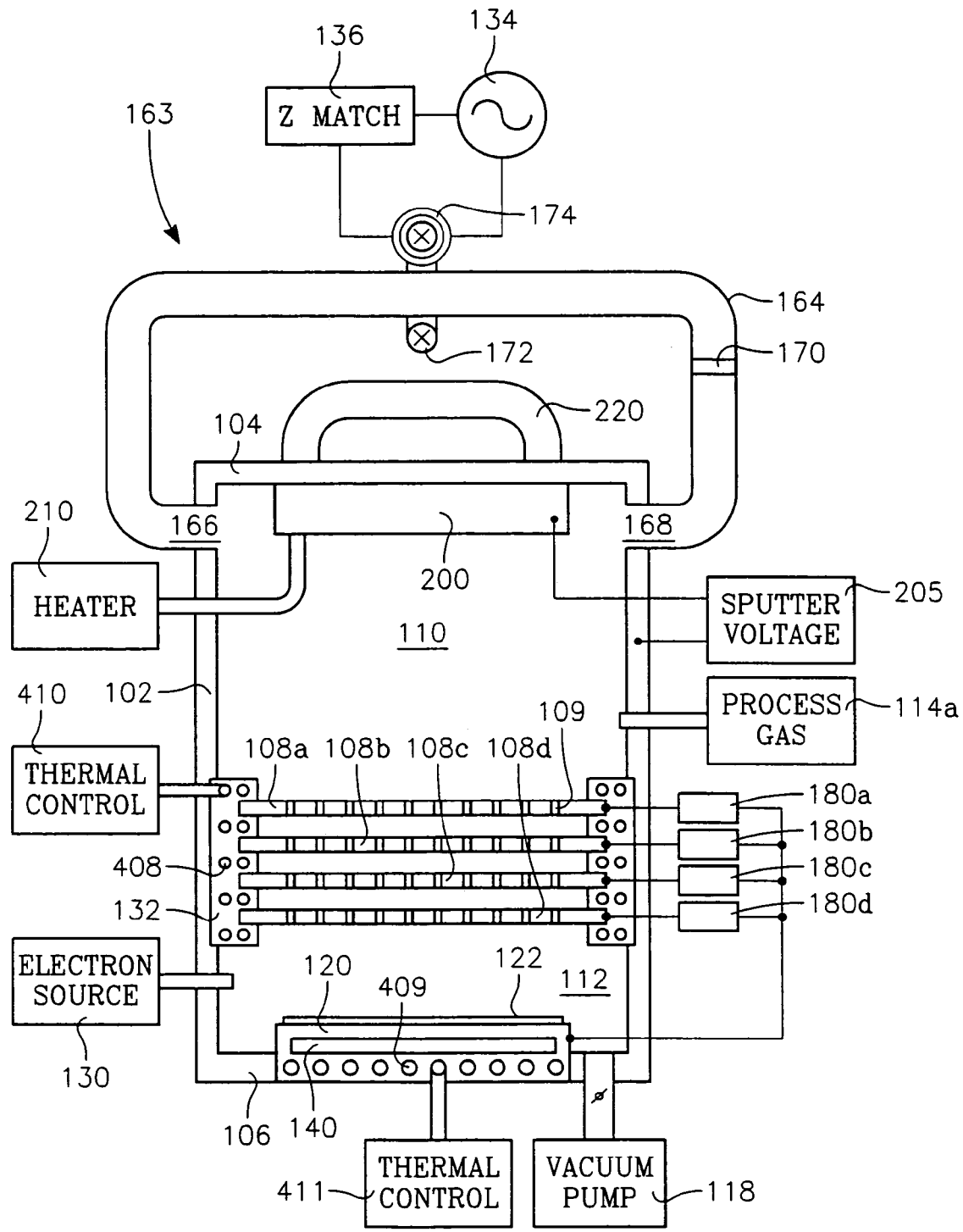
FIG. 21 illustrates a CVD reactor having an ion sputter source, multiple ion shower grids and a toroidal plasma source power applicator.

FIG. 21 illustrates the combination of a reactive PVD reactor of the type illustrated in FIG. 18 further having multiple grids 108a-108d and a torroidal plasma source power applicator 163. The torroidal plasma source power applicator consists of at least one reentrant hollow external conduit 164 connected to opposite sides of the upper chamber 110 at opposing openings or ports 166, 168. The conduit 164 can be conductive and includes a D.C. break filled by an insulating ring 170. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 22:
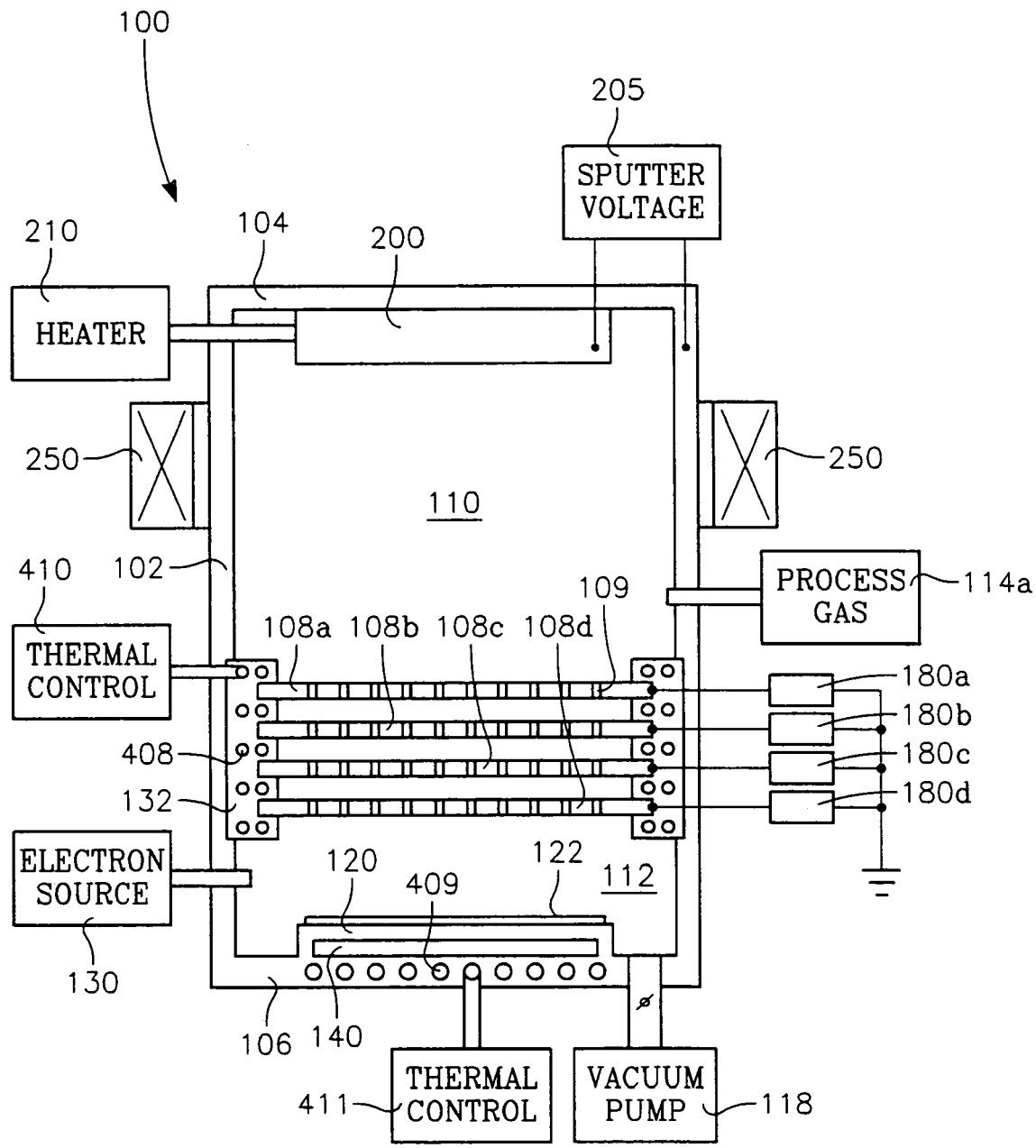
FIG. 22 illustrates a CVD reactor having an ion sputter source, multiple ion shower grids and a microwave plasma source power applicator.

FIG. 22 illustrates a PVD reactor of the type illustrated in FIG. 18 further having multiple grids 108a-108d and a microwave plasma source power applicator 250.

Figure 23:
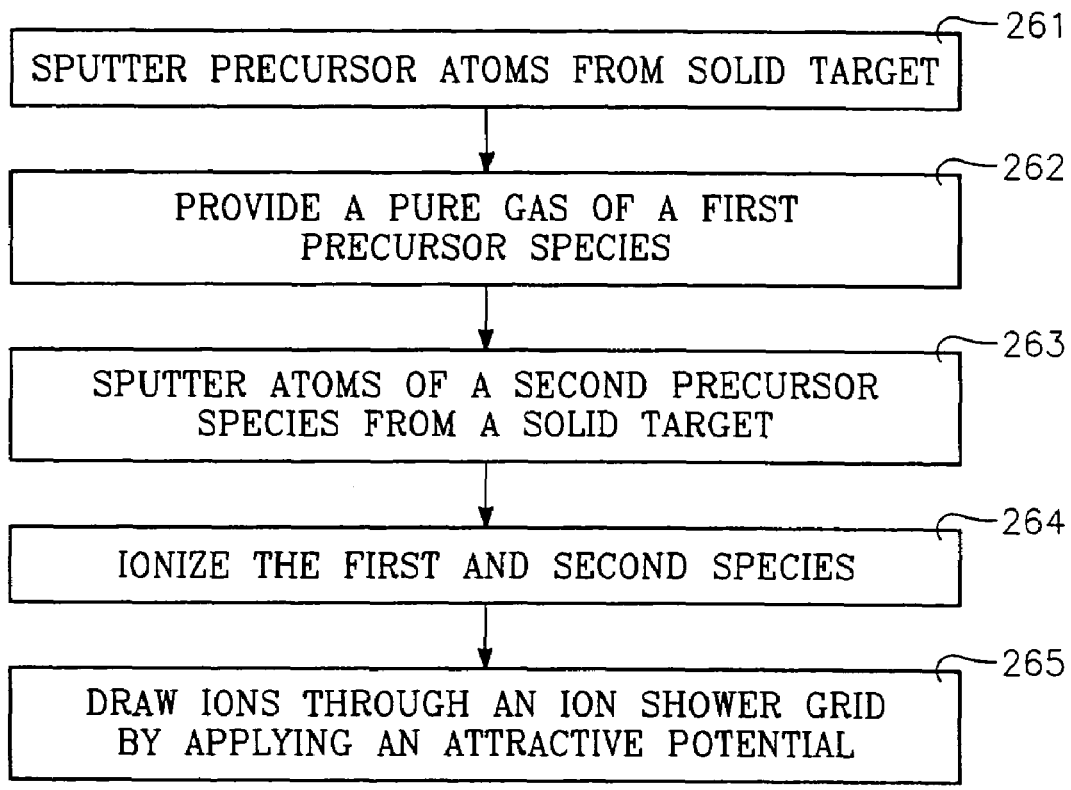
FIG. 23 depicts a process of which the reactors of FIGS. 19-22 are capable of performing.

In the PVD reactors of FIGS. 18-22, a chemical vapor deposition process is performed in accordance with the steps of FIG. 23, as follows: Furnish a pure gas of a first deposition precursor species, e.g., oxygen or nitrogen (block 261 of FIG. 23). Sputter atoms from a pure solid target 200 of a second deposition precursor species, e.g., silicon (block 262). Ionize the atoms of the first and second species (block 263). Produce a pressure drop across an ion shower grid 108 separating the plasma generation region 110 from the wafer 122. And, apply an attractive potential to the ion shower grid 108 to produce a collimated ion flux of the first and second species covering the area of the wafer 122 (block 264 of FIG. 23). Additional steps include increasing the attractive (ion acceleration) potential of the grid 108 until the angular distribution of ion trajectories at the wafer surface is sufficiently narrow to prevent pinch off in HAR openings (block 265). Or, the attractive grid potential is increased sufficiently to suppress at the wafer surface the population of thermal neutrals while promoting the population of ions and fast neutrals.

In the CVD reactors of FIGS. 1-17 and 19-22, the ion acceleration voltage on the grid 108 or multiple grids 108a-d was created by applying a large positive potential to the plasma and lesser potential(s) to the grid 108 or successive grids 180a-108d, the wafer 122 being at the minimum potential (ground). As a result the plasma chamber including the ceiling 102 and side wall 104 and any source power applicator are at such a high potential that they must be carefully isolated. In an alternative arrangement, the applied grid voltage is negative, the voltages being reversed. The plasma is placed at the lowest potential (neglecting the potential induced by the plasma source power applicator), and negative pulsed voltages are applied of progressively greater magnitudes starting from the grid 108 (or top grid 108a in multi-grid embodiments) and culminating at the greatest negative voltage at the wafer support pedestal 120. One advantage of this alternative arrangement is that that wafer support pedestal 120 is at the highest voltage and must be electrically isolated. (In contrast, in the above-described embodiments, in general the upper chamber 110 is at the highest potential and therefore must be electrically isolated.) A high voltage wafer pedestal can be provided as disclosed in U.S. patent application Ser. No. 10/646,533, filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE by Kenneth S. Collins et al.

Leaving the plasma at the minimum negative potential (e.g., ground) and maintaining the wafer support pedestal 120 at the greatest negative potential is particularly suitable for cases in which the plasma source power applicator imparts only a small voltage to the plasma. This is the case in FIG. 24 in which the plasma source power applicator is a torroidal plasma source, which can raise the plasma potential by as little as 100 Volts, for example, while still attaining an adequate plasma ion density. The torroidal plasma source power applicator 163 consists of at least one reentrant hollow external conduit 164 connected to opposite sides of the upper chamber 110 at opposing openings or ports 166, 168. The conduit 164 can be conductive and includes a D.C. break filled by an insulating ring 170. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 24:
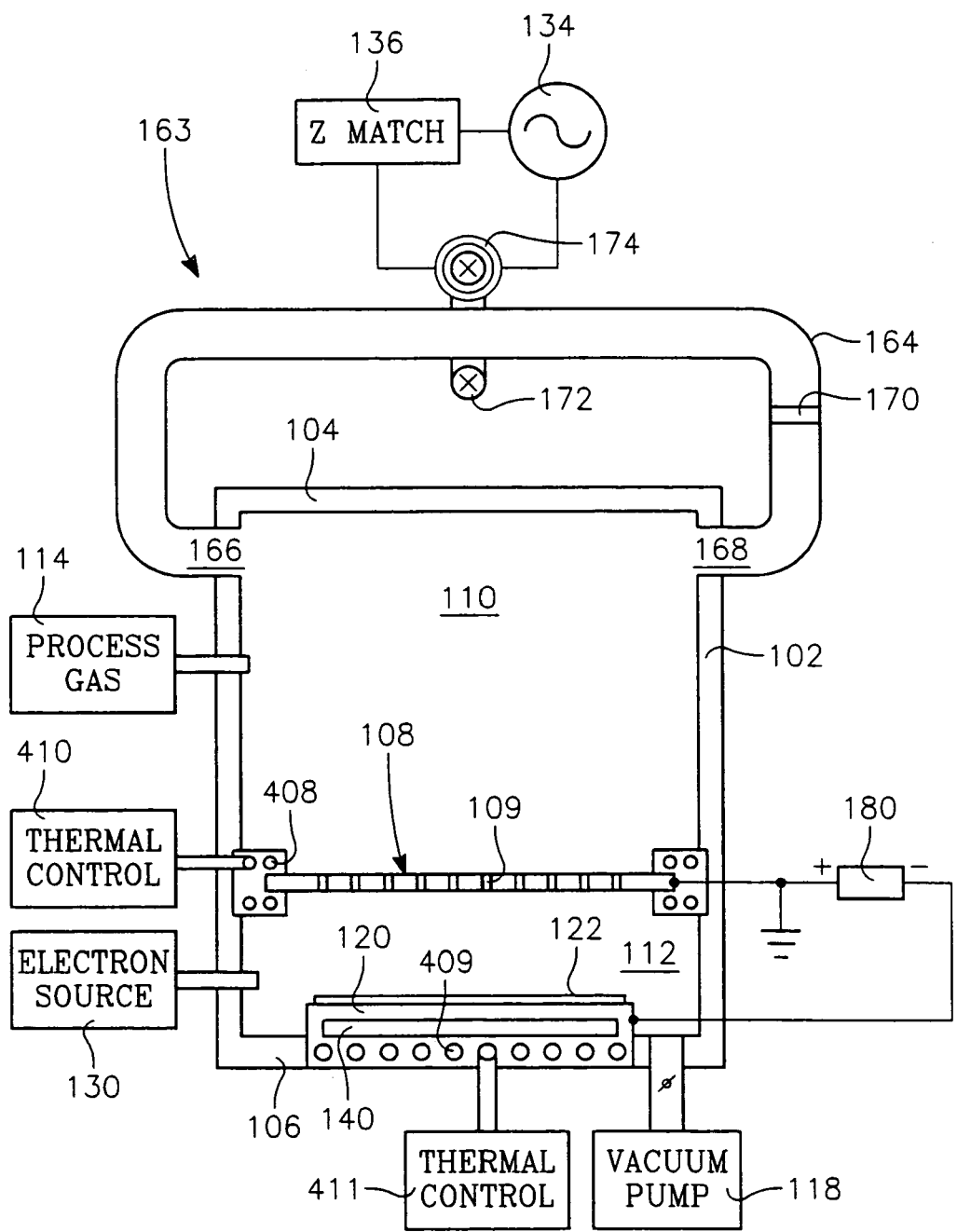
FIG. 24 depicts a CVD reactor with a torroidal plasma source and an ion shower grid driven in reverse mode.

In the embodiment of FIG. 24, there is a single ion shower grid 108 and a single grid voltage supply 180. The grid 180 and the wafer pedestal 120 may be electrically insulated from one another and/or from the chamber surfaces such as the side wall 102 and/or the ceiling 104. FIG. 25A depicts the time domain waveform of the negative voltage D.C. pulses applied by the grid voltage supply 180 (e.g., 5 kV pulses). In the reactor of FIG. 24, the negative output of the grid voltage supply 180 is connected to the wafer support pedestal 120, while the opposite (return) terminal of the grid voltage supply 180 is connected to the grid 108. In this way, the plasma is at a very low voltage (e.g., 100 Volts RF centered at 0 Volts D.C.) while the wafer 122 is at a maximum negative voltage (e.g., −5 kV). FIG. 25B illustrates the resulting wafer-to-plasma potential which is a superposition of the 5 kV voltage of the grid voltage source 180 and the 100 V output of the RF source power generator 134.

FIG. 26 illustrates how the reactor of FIG. 24 may be modified by introducing multiple ion shower grids 108a through 108d and corresponding grid voltage supplies 180a through 180d. In addition, a voltage supply 180e drives the wafer support pedestal 120. In one implementation, each of the voltages sources 180a-180e has its negative output connected to the respective grid/pedestal and its return terminal connected to a common return, as indicated in FIG. 26. The reactor of FIG. 26 may be operated in the manner of FIGS. 12A through 12E so as to apply successively more attractive potentials from the top grid 108a to the bottom grid 108d, and applying the most attractive potential (i.e., the most negative) to the wafer support pedestal 120. The voltage sources 180a-180e may be referenced to the plasma by connecting their common return to an upper chamber surface 102 or 104. In another aspect, the reactor of FIG. 26 may be operated in a mode analogous to that of FIGS. 13A through 13E, in which voltages of alternate polarities are applied to the succession of grids 180a-180d so as to focus ions toward the centers of the grid orifices 109, except that in the embodiment of FIG. 26 the attractive voltages are negative in this mode.

Each voltage source 180a, 180b, 180c, 180d, 180e may either produce a pulsed D.C. voltage or an RF sinusoidal voltage. If an RF voltage is produced, then each voltage source can include an RF generator and an impedance match circuit.

Figure 27:
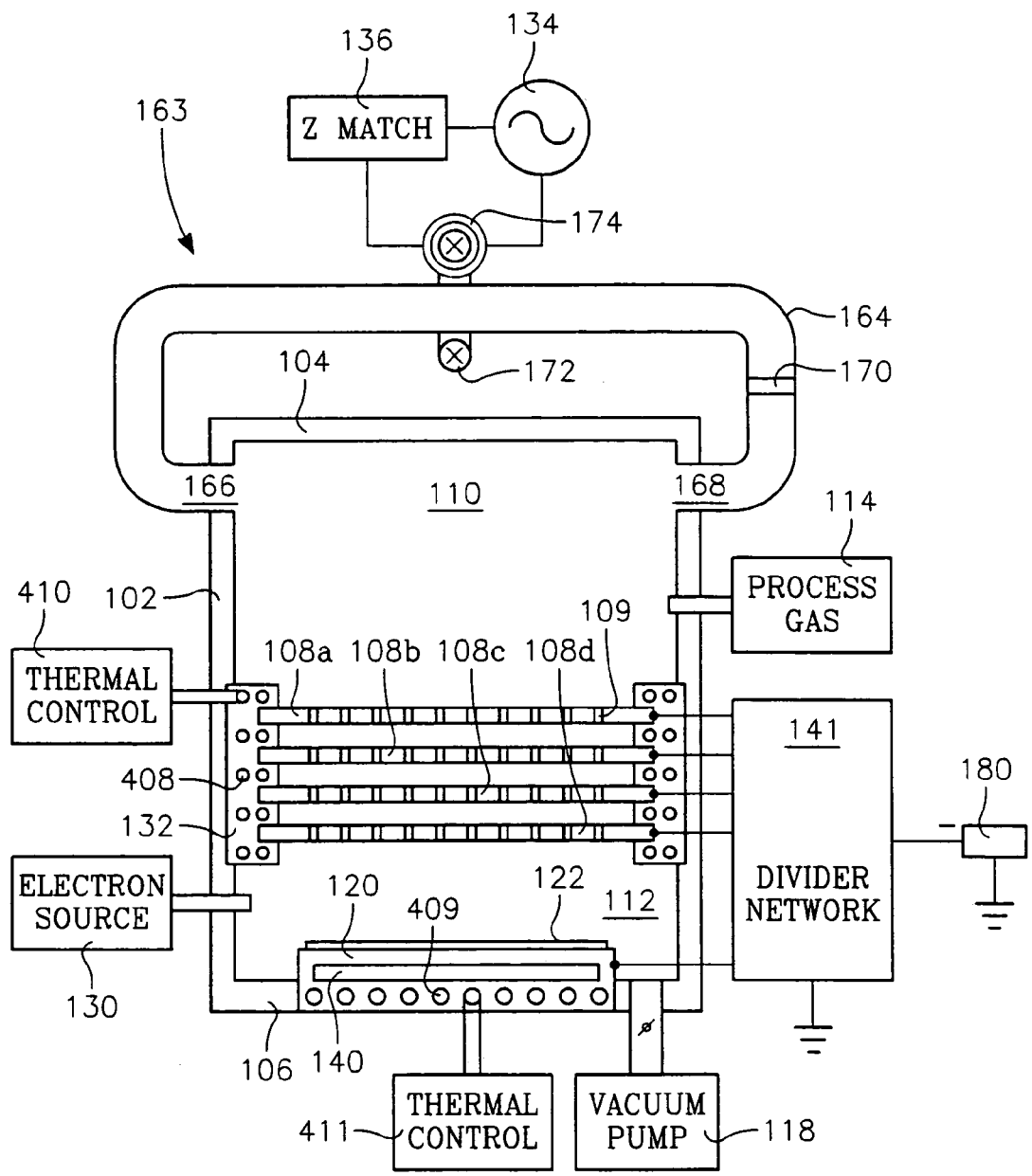
FIG. 27 depicts a CVD reactor with a torroidal plasma source and multiple ion shower grids driven in reverse mode using a single grid voltage source and a voltage divider with multiple outputs.

FIG. 27 illustrates how the multiple ion shower grids of FIG. 26 may be driven by a single voltage source through a voltage divider network 141 of the type described above with reference to FIGS. 5 and 6.

In the foregoing embodiments, the voltage applied to the wafer support pedestal 120, for example by the grid voltage supply 180 in the embodiment of FIG. 24 or by the grid voltage supply 180e in the embodiment of FIG. 26, may have an RF component in addition to a pulsed or pulsed D.C. component. The RF component aids in selecting or adjusting the ion energy distribution or may aid in discharging the wafer or avoiding excessive charge build-up on the wafer surface.

The spacing between adjacent orifices 109 in the grid 108 or in each multiple grid 108a-d determines the number of orifices the grid and therefore controls the gas conductance and the pressure drop, which is inversely proportional to the gas conductance. It also determines the thermal conductance across the diameter of the grid upon which the thermal controller 410 (FIG. 1) depends. By limiting the number of orifices 109 in the grid 108, the grid thermal conductance enhanced and the pressure drop between the sub-chambers 110, 112 is also enhanced. The pressure drop enhances the population of vertically traveling ions in the lower sub-chamber 112 by reducing the ion-neutral collision frequency and lengthening the ion-neutral mean free path length. The orifice length (aspect ratio) is determined by the grid thickness and should be limited to avoid excessive ion losses by recombination on the internal surfaces of the grid orifices 109. On the other hand, the length must be sufficient to promote a narrow distribution of vertical ion trajectories about the perpendicular relative to the wafer surface. There should be some divergence in the ion trajectory distribution to enable ions to traverse the orifice-to-orifice spacing in the grid 108 by the time they reach the wafer 122 for uniform deposition on the wafer surface. This is attained by a combination of limited orifice aspect ratio and sufficient grid-to-wafer gap length. A longer gap length is accommodated without creating excessive ion scattering in the lower sub-chamber 112 by imposing a sufficient pressure drop across the grid 108 (to keep the lower sub-chamber pressure very low so as to limit ion-neutral collisions.

Figure 28A:
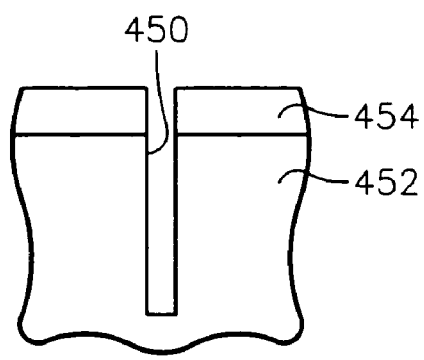
FIGS. 28A, 28B, 28C and 28D depict the CVD process carried out on a shallow isolation trench in accordance with the invention.
Figure 28B:
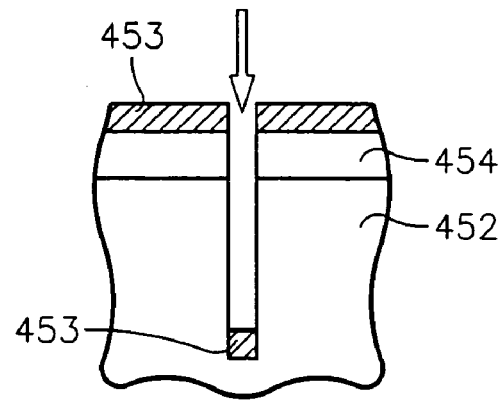
Figure 28C:
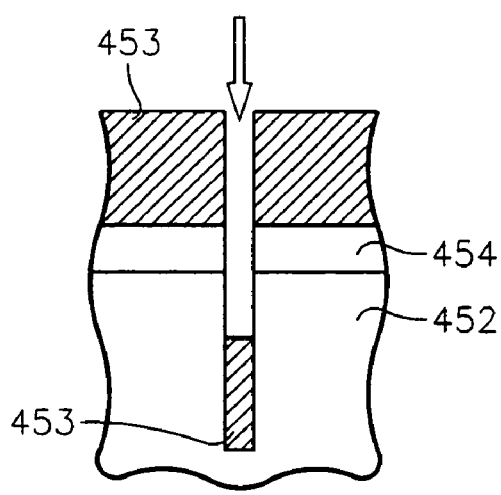
Figure 28D:
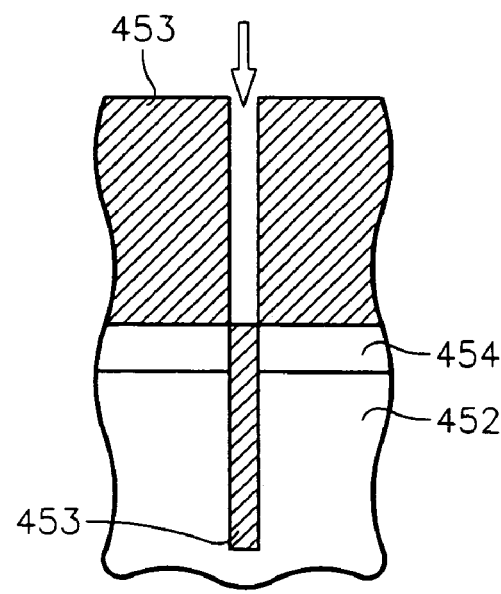

FIGS. 28A through 28D depict the filling of a shallow isolation trench in a semiconductor wafer by a CVD process performed by the reactor of any one of FIG. 1-17 or 19-26. The shallow isolation trench 450 (FIG. 28A) may be formed in a semiconductor substrate 452 and an overlying dielectric layer 454 (such as a field oxide layer). The trench 450 may have an aspect ratio as high as ten and may have a width on the order of only 65 nm or smaller. The extremely narrow distribution of ion trajectories about the vertical direction of which these reactors are capable enables nearly all of the ions incident within the diameter of the trench 450 to travel all of the way to the bottom of the trench 450 where they begin to fill the trench from the bottom up (FIG. 28B). The deposited material 453 is indicated by hatching. In FIG. 28C, the trench 450 is about half filled and in FIG. 28D the trench 450 is completely filled without any voids. In this stage of the wafer processing, there are no features present that can be distorted or diffused by high temperatures, such as doped source and drain regions in the substrate, for example, and therefore the deposited layer may be annealed if desired. Moreover, a higher ion flux and energy may be used without regard to plasma heating of the wafer. In fact, it may be beneficial to heat the wafer to an elevated temperature, for a higher quality deposited layer 453 in the trench 450. The wafer thermal controller 411 (FIG. 1) may be employed to elevate and control the wafer temperature for this purpose. For other applications, it may be beneficial to cool the wafer with the wafer pedestal thermal controller 411.

Figure 29:
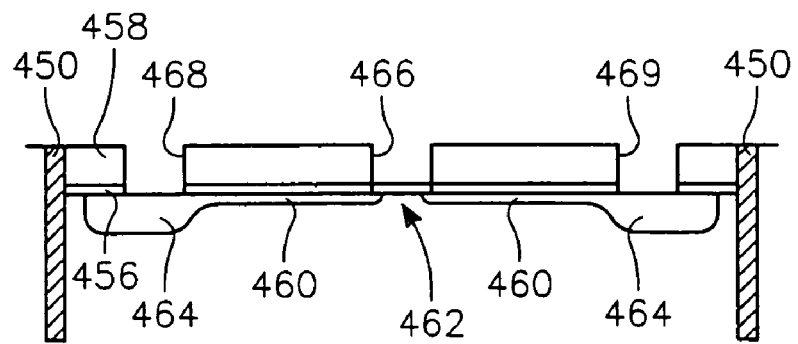
FIGS. 29, 30A and 30B depict a pre-metal CVD process.
Figure 30A:
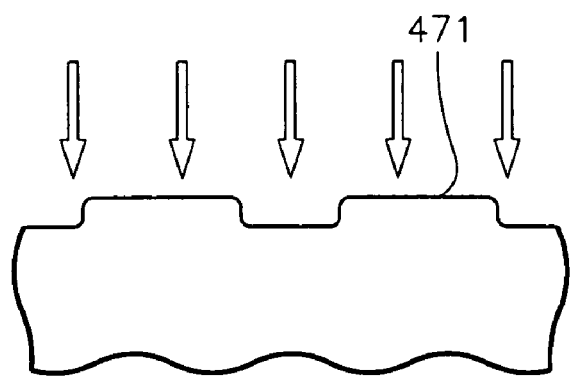
Figure 30B:
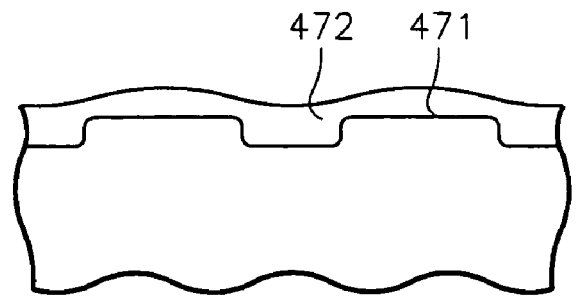

FIGS. 29, 30A and 30B illustrate changes in the semiconductor thin film surface during a pre-metal deposition process. FIG. 29 corresponds to the beginning of the pre-metal deposition process and depicts an enlarged view of the thin film structure of a metal oxide semiconductor field effect transistor (MOSFET) prior to the deposition of metal. The structure includes the substrate 452, the isolation trenches 450, a thin gate silicon dioxide layer 456, an overlying dielectric layer 458. In the surface of the substrate there are source and drain shallow extensions 460 facing one another across a channel region 462, and deep source and drain contacts 464 joined with the shallow source and drain extensions 460. A gate contact hole 466 is formed over the channel through the dielectric layers 456, 458 and source/drain contact holes 468, 469 are formed over the deep source/drain contacts 464 through the dielectric layers 456, 458.

FIG. 30A is a much wider view of the same wafer as FIG. 29 except that the small MOSFET structures are not clearly visible in this wider view. What FIG. 30A does show is the non-uniform nature of the top surface formed by the structural features of FIG. 29. The abrupt vertical transitions or mesas 471 on the surface make metal coverage very difficult. Therefore, a CVD process is performed to deposit a high quality dielectric layer over this structure having more gradual vertical transitions. The CVD process described above may be performed with any of the reactors of FIGS. 1-26 to produce a passivation layer 472 shown in FIG. 30B. The gate contact holes 466 and the source/drain contact holes 468, 469 of FIG. 29 are continued through the passivation layer 472 of FIG. 30B.

The reactor performance may be enhanced by reducing contamination during processing. This is accomplished by carrying out a pre-process chamber seasoning step before the production wafer 122 is inserted into the chamber. In this seasoning step, the interior chamber surfaces are coated with a thin anti-contamination layer consisting of a process-compatible material. Such a process-compatible material depends upon the particular process to be performed by the reactor, and may be silicon dioxide or silicon nitride, as two possible examples. This pre-process chamber seasoning step is carried out the using the plasma source power applicator provided in most of the foregoing embodiments. In carrying out the pre-process chamber seasoning step, a suitable precursor gas such as silane and oxygen or silane and nitrogen is introduced in to the chamber, and a plasma is struck and maintained by the plasma source power applicator for a sufficient amount of time and at a sufficient source power level/plasma density to coat the interior chamber surfaces with the anti-contamination coating to the desired thickness. The grid 108 or grids 108a-d may be energized to draw the plasma from the ion generation sub-chamber 110 into the process sub-chamber 112 to ensure the seasoning process is carried out in the entire chamber. The plasma source power applicator may be the capacitively coupled plasma source power applicator 134, 136 of FIG. 4, the inductively coupled plasma source power applicator 160 of FIG. 8, the torroidal plasma source 163 of FIG. 9A or the microwave plasma source power applicator 179 of FIG. 10, for example. Embodiments illustrated as including a plasma source power applicator include the embodiments of FIGS. 3, 4, 8-11, 14-17, 19-22 and 24-26. In addition, the embodiment of FIG. 1 combines the function of plasma source power and grid voltage in the voltage source 124, which may therefore be used to carry out the chamber pre-process seasoning step. In the embodiment of FIG. 18, which has no plasma source power applicator for the ion generation sub-chamber 110, the chamber pre-process seasoning step may be carried out using an external plasma source 101 which furnishes plasma ions or radicals either or both the ion generation sub-chamber 110 and the process sub-chamber 112. Such an external plasma source may also be provided in any of the other embodiments for the same purpose.

Reactor performance may be enhanced by carrying out a post-process chamber cleaning step after the production wafer 122 has been removed from the chamber. For those embodiments noted above having a plasma source power applicator, a cleaning pre-cursor gas, such as $NF_3$, is introduced by the process gas supply 114a or 114b and a plasma is struck and maintained for a sufficient time and at a sufficient plasma density to efficiently clean the interior chamber surfaces. This may include removal of the anti-contamination coating deposited in the chamber pre-process seasoning step. The grid 108 or grids 108a-d are energized to draw plasma into the process chamber 112 so that all chamber interior surfaces are adequately cleaned. This post-process chamber cleaning step may also be performed in any of the disclosed embodiments using the external plasma source 101 (shown in FIG. 18). The external plasma source 101 may furnish cleaning ions or cleaning radicals (such as ions or radicals derived from $NF_3$, to either or both the ion generation sub-chamber 110 and the process sub-chamber 112.

Description of at least some of the foregoing embodiments has been made with reference to a feature in which the grid 108 and wafer support pedestal 120 are driven with different voltages. For example, in the embodiment of FIG. 4, the voltage difference between the grid 108 and the wafer support pedestal 120 produces an attractive potential that accelerates ions emerging from the grid 108 into the process sub-chamber 112 toward the wafer support pedestal 120. However, in accordance with another feature, the same voltage drives both the wafer support pedestal 120 and the grid 108 (in the single grid embodiments of FIGS. 1-10) or the bottom grid 108d (in multi-grid embodiments of FIGS. 11-18, for example). The purpose of this feature is to apply no accelerating force to ions in the process sub-chamber 112, so that they only drift from the grid 108 (or bottom grid 108d) to the wafer 122. The drift velocity depends upon the voltage difference between the plasma in the ion generation sub-chamber 110 and the grid 108. This feature reduces ion beam divergence in the process sub-chamber 112.

In certain embodiments described above, such as the embodiments of FIGS. 24 and 26, power is applied directly to the wafer support pedestal 120. For example, the power source 180 establishes a voltage on the wafer 122 in the embodiment of FIG. 24, and the power source 180e establishes a voltage on the wafer 122 in the embodiment of FIG. 26. This power can include an RF component, and establishes a plasma bias voltage across the plasma sheath that exists over the surface of the wafer 122. The frequency of the RF component or bias power can be chosen to satisfy the following criteria: The RF bias frequency is sufficiently high to have a negligible voltage drop across the pedestal (cathode) dielectric layers and minimize sensitivity to dielectric films on the backside or front side of the wafer and minimize sensitivity to chamber wall surface conditions or deposition of plasma by-products. Moreover, the RF bias frequency is sufficiently high to have a cycle time not significantly exceeding the initial period (e.g., one micro-second) before resistive-capacitive (RC) effects reduce ion energy more than 2% below a desired target energy. Furthermore, the RF bias frequency is sufficiently high to couple across insulating capacitances such as films on the wafer surface, dielectric layers on the wafer support pedestal, coatings on the chamber walls, or deposited films on the chamber walls. (An advantage of RF coupling of the bias voltage to the wafer is that such coupling does not rely upon ohmic contact and is less affected by changes or variations in the surface conditions existing between the wafer and the support pedestal.) However, the RF bias frequency should be sufficiently low so as to not generate significant plasma ions and electron density (leaving that task to the plasma source power applicator). More importantly, the RF bias frequency should be sufficiently low for the ions to respond to the oscillations of the electric field in the plasma sheath overlying the wafer surface. The considerations underlying this last requirement are now discussed with reference to FIGS. 31A through 31D.

Figure 31A:
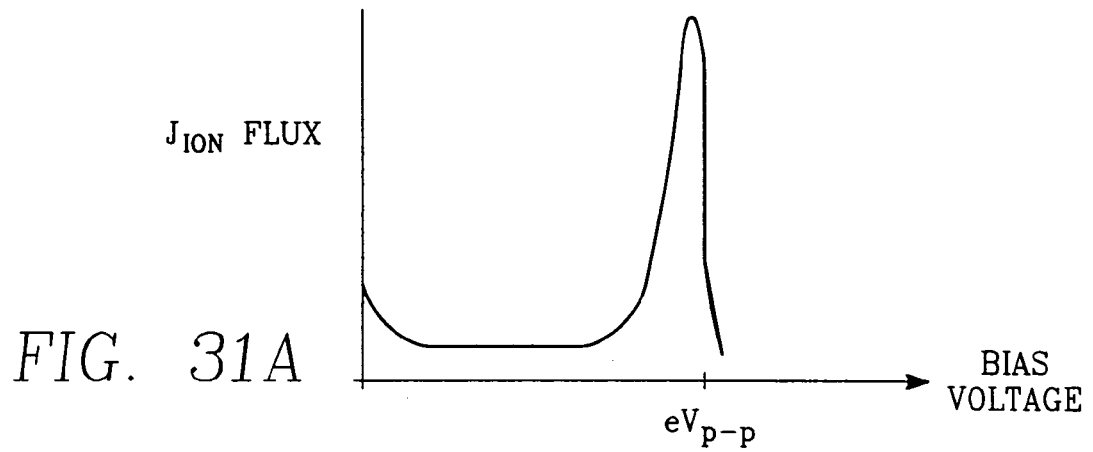
FIGS. 31A, 31B, 31C and 31D illustrate, respectively, an ion energy distribution, one cycle of an RF bias voltage, an ion saturation current as a function of D.C. bias voltage and ion energy distributions for different bias frequencies.
Figure 31B:
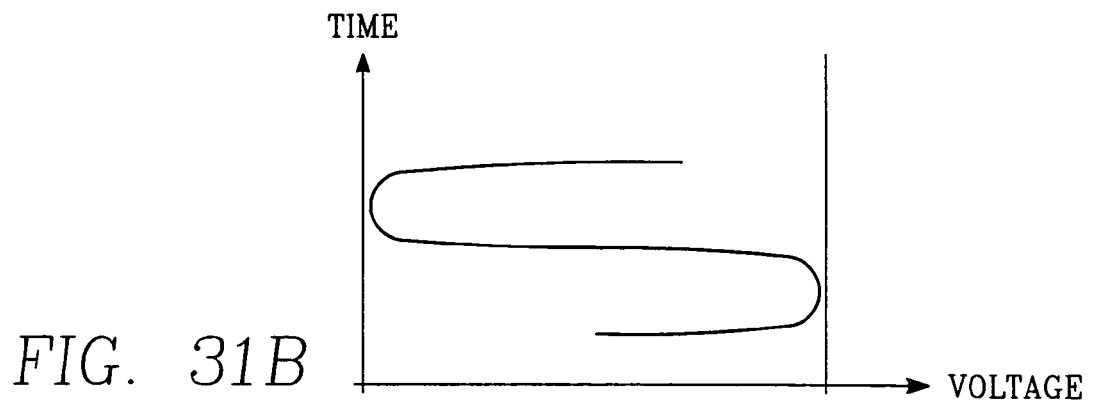
Figure 31C:
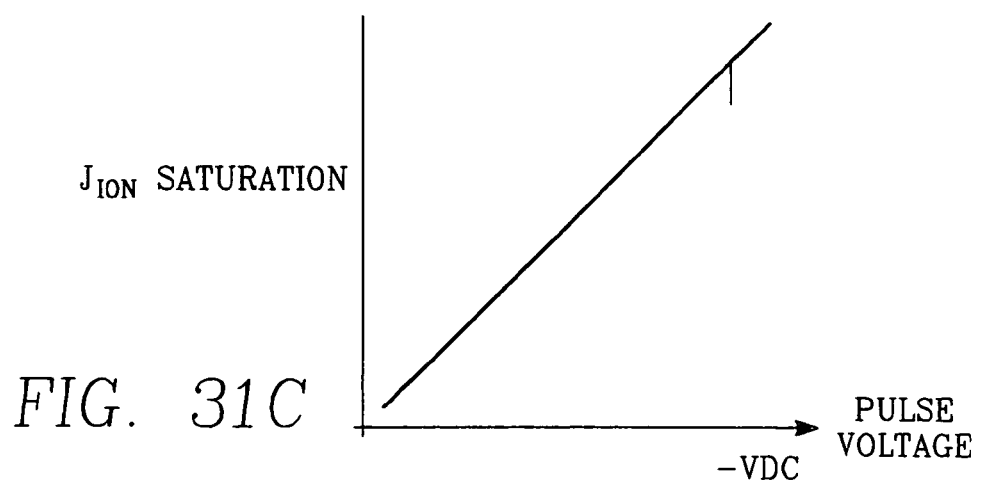
Figure 31D:
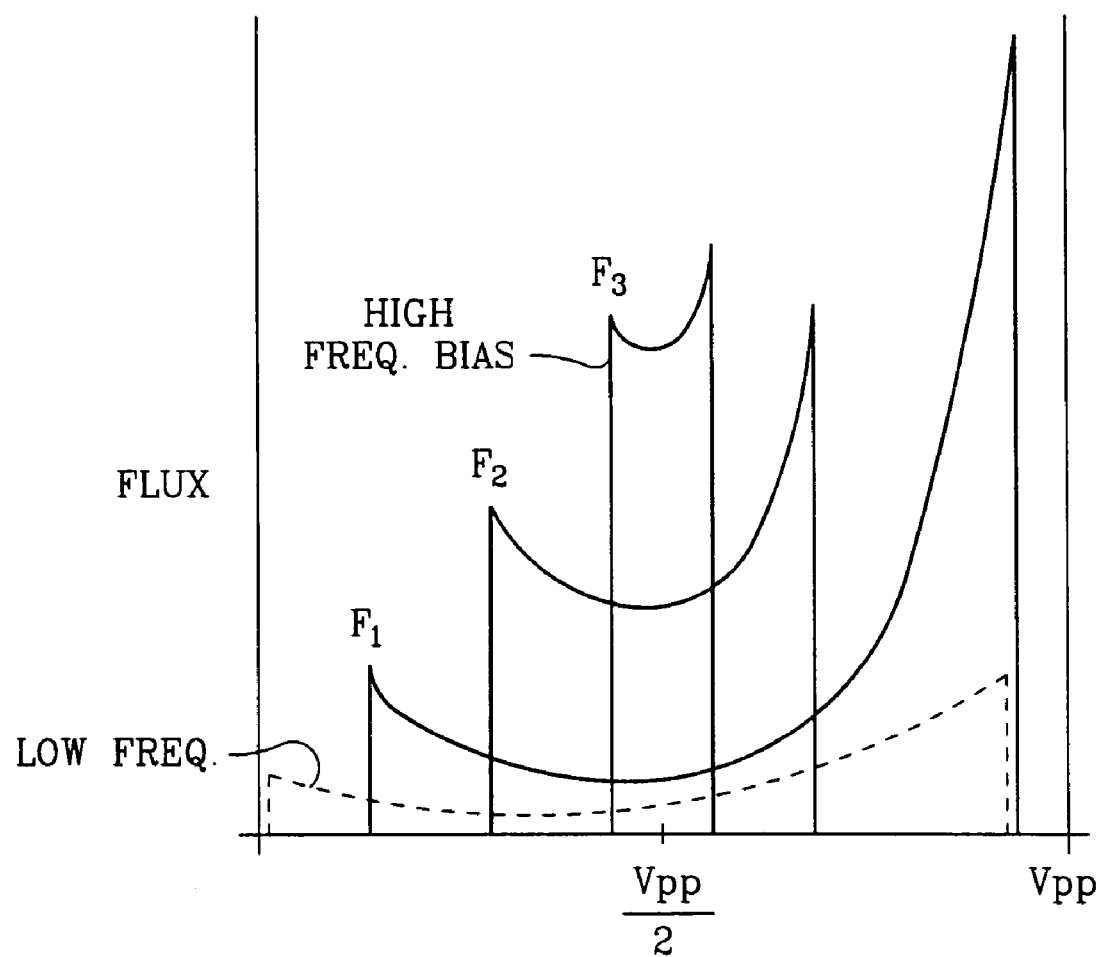

FIG. 31A illustrates the plasma ion saturation current at the wafer surface as a function of D.C. bias voltage applied to the wafer, the current being greatest (skewed toward) the higher voltage region. FIG. 31B illustrates the oscillation of the applied RF bias voltage on the wafer 122. The asymmetry of the ion saturation current illustrated in FIG. 31A causes the ion energy distribution created by the RF bias voltage of FIG. 31B to be skewed in like manner toward the higher energy region, as illustrated in FIG. 31C. The ion energy distribution is concentrated most around an energy corresponding to the peak-to-peak voltage of the RF bias on the wafer. But this is true only if the RF bias frequency is sufficiently low for ions to follow the oscillations of the electric field in the plasma sheath. This frequency is generally a low frequency around 100 kHz to 3 MHz, but depends on sheath thickness and charge-to-mass ratio of the ion. Sheath thickness is a function of plasma electron density at the sheath edge and sheath voltage. Referring to FIG. 31D, as this frequency is increased from the low frequency (denoted F1 in FIG. 31D) to a medium frequency (denoted F2 in FIG. 31D) and finally to a high frequency such as 13 MHz (denoted F3 in FIG. 31D), the ability of the ions to follow the plasma sheath electric field oscillation is diminished, so that the energy distribution is narrower. At the HF frequency (F3) of FIG. 31D, the ions do not follow the sheath electric field oscillations, and instead achieve an energy corresponding to the average voltage of the RF bias voltage, i.e., about half the RF bias peak-to-peak voltage. As a result, the ion energy is cut in half as the RF bias frequency increases to an HF frequency (for a constant RF bias voltage). Furthermore, at the medium frequency, we have found that the plasma behavior is unstable in that it changes sporadically between the low frequency behavior (at which the ions have an energy corresponding to the peak-to-peak RF bias voltage) and the high frequency behavior (at which the ions have an energy corresponding to about half the peak-to-peak RF bias voltage). Therefore, by maintaining the RF bias frequency at a frequency that is sufficiently low (corresponding to the frequency F1 of FIG. 31D) for the ions to follow the plasma sheath electric field oscillations, the RF bias peak-to-peak voltage required to meet a desired ion energy requirement is reduced by a factor of nearly two, relative to behavior at a medium frequency (F2) or a high frequency (F3). This is a significant advantage because such a reduction in the required RF bias voltage (e.g., by a factor of two) greatly reduces the risk of high voltage arcing in the wafer support pedestal and the risk of damaging thin film structures on the wafer.

In view of the foregoing dependency of ion energy distribution on the RF bias frequency, ion energy can be controlled by controlling RF bias frequency. Specifically, the RF bias frequency can be varied from the high frequency F3 of FIG. 31D (at which the ion energy ranges from a maximum energy corresponding to the peak-to-peak RF bias voltage down to nearly zero), down to the low frequency F1 of FIG. 31D (at which the ion energy is confined to a narrow band corresponding to half the peak-to-peak RF bias voltage).

Good results are attained by restricting the RF bias power frequency to a low frequency range between 10 kHz and 10 MHz. Better results are obtained by limiting the RF bias power frequency to a narrower range of 50 kHz to 5 MHz. The best results are obtained in the even narrower bias power frequency range of 100 kHz to 3 MHz. We have found optimum results at about 2 MHz plus or minus 5%.

While the invention has been described in detail by specific reference to preferred embodiments, it is understood that variations and modifications thereof may be made without departing from the true spirit and scope of the invention.

While the invention has been described in detail by specific reference to preferred embodiments, it is understood that variations and modifications thereof may be made without departing from the true spirit and scope of the invention.

While the CVD process using a grid has been described with reference to both RF and D.C. grid voltages or acceleration voltages or bias voltages, if the layer deposited in the CVD process is an insulating or dielectric layer, then the problem of charge accumulation must be avoided or at least minimized. The charge up of the insulating layer may change the resultant ion energy at the wafer surface. Such charge up occurs when a D.C. or pulsed D.C. voltage is employed as the grid voltage or bias voltage or acceleration voltage. This problem is minimized or avoided by employing RF voltages for the grid voltage, the wafer bias voltage and/or the acceleration voltage.

What is claimed is:

1. A plasma reactor for processing a semiconductor workpiece, comprising:
   a reactor chamber;
   a set of plural parallel ion shower grids stacked together that divide said chamber into an upper ion generation region and a lower process region, said process region containing no grids, each of said ion shower grids having plural collinear cylindrical hole orifices from grid to grid, each orifice being oriented in a transverse direction relative to a surface plane of the respective ion shower grid;
   a workpiece support in said process region facing the lowermost one of said ion shower grids whereby said process region is bounded between the lowermost one of said ion shower grids and said workpiece support;
   a reactive species source for furnishing into said ion generation region a chemical vapor deposition precursor species;
   a vacuum pump coupled to said process region;
   a plasma source power applicator for generating a plasma in said ion generation region;
   a grid potential source of radio frequency (RF) power coupled to said set of ion shower grids, the orifices through at least some of said ion shower grids having:
   (a) an aspect ratio sufficient to limit ion trajectories in said process region to a narrow angular range about said non-parallel direction,
   (b) a resistance to gas flow sufficient to support a pressure drop between said ion generation and process regions of about at least a factor of 4.

2. The reactor of claim 1 wherein said grid potential source comprises a set of independently controllable RF grid potential sources coupled to respective ones of said set of ion shower grids.

3. The reactor of claim 1 wherein said resistance to gas flow is sufficient to maintain an ion-neutral mean collision distance in said process region in excess of a multiple of a distance between said workpiece and said ion shower grid.

4. The reactor of claim 1 wherein said grid potential source comprises respective grid potential sources coupled to respective ones of said grids, at least some of said plural grid potential sources providing successively greater attractive potentials for ions.

5. The reactor of claim 2 wherein said set of grid potential sources comprises a single voltage source coupled to a voltage divider having plural voltage output terminals coupled to respective ones of said set of ion shower grids.

6. The reactor of claim 1 further comprising a temperature controller thermally coupled to said ion shower grids.

7. The reactor of claim 6 wherein said temperature controller comprises internal fluid flow passages thermally coupled to said ion shower grid and a pump for pumping a coolant through said internal fluid flow passages.

8. The reactor of claim 1 further comprising a neutralization source for furnishing electrons into the vicinity of said workpiece support.

9. The reactor of claim 8 wherein said neutralization source comprises a magnetic field source near said workpiece having sufficient magnetic flux to trap electrons near said workpiece support.

10. The reactor of claim 8 wherein said neutralization source comprises an electron gun oriented toward said workpiece support.

11. The reactor of claim 8 wherein said neutralization source comprises a source for furnishing an electron-donor gas into said process region and near said workpiece.

12. The reactor of claim 11 wherein said electron-donor gas comprises Zenon.

13. The reactor of claim 1 wherein said plasma source power applicator comprises an external reentrant conduit coupled across said ion generation region and an RF power applicator for coupling RF plasma source power into the external reentrant conduit.

14. The reactor of claim 13 further comprising a bias potential source coupled to said workpiece support.

15. The reactor of claim 14 wherein said bias potential source comprises an RF voltage source.

16. The reactor of claim 1 wherein said reactive species source comprises:
   a semiconductor sputtering target in said ion generation region;
   a sputter source coupled to said target for sputtering atoms from said target into said ion generation region for ionization by plasma source power coupled from said plasma source power applicator.

17. The reactor of claim 16 wherein said sputter source comprises a sputter voltage source coupled to said sputtering target.

18. The reactor of claim 17 wherein said sputter source comprises an external plasma source coupled to said ion generation region.

19. The reactor of claim 1 further comprising an external plasma source furnishing ions or radicals to at least one of said ion generation and process regions.

20. The reactor of claim 1 further comprising an electrical connection between said wafer support and said ion shower grid for holding said ion shower grid and said wafer support at the same electrical potential.

21. The reactor of claim 1 wherein said workpiece support is translatable in the plane of said workpiece for scanning an ion beam from said grid across said workpiece.

22. The reactor of claim 21 wherein said workpiece support has a larger diameter than said grid.

23. The reactor of claim 1 wherein said workpiece support is tiltable for tilting said workpiece relative to said grid.

24. The reactor of claim 1 further comprising thermal control apparatus coupled to said wafer support pedestal for heating or cooling the workpiece.

25. The reactor of claim 24 wherein said wafer support pedestal comprises an electrostatic chuck.

26. The reactor of claim 6 wherein said voltage divider further has an output terminal coupled to said workpiece support pedestal.

27. The reactor of claim 26 wherein said voltage divider couples from said single potential source a reference potential to the grid nearest said ion generation region, and successively greater ion-attractive voltages to successive ones of the other grids and a highest ion-attractive potential to the wafer support pedestal.

28. The reactor of claim 27 wherein said reference potential is ground.

29. The reactor of claim 27 wherein said plasma source power applicator comprises a toroidal plasma source comprising an external reentrant conduit having opposing ends coupled to opposite sides of said chamber, said plasma source power applicator positioned to couple RF plasma source power into said ion generation region.

30. The reactor of claim 1 wherein said plural grids are joined at their peripheries to a side wall of said reactor whereby to limit gas flow between said ion generation and process regions to orifices in said grids.

31. The reactor of claim 1 wherein said reactive species source comprises a gas injection orifice opening into said ion generation region and a process gas supply coupled to said gas injection orifice for furnishing a process gas containing said chemical vapor deposition precursor species.

* * * * *